US011032905B2

(12) United States Patent
Lassini

(10) Patent No.: US 11,032,905 B2
(45) Date of Patent: Jun. 8, 2021

(54) UNMANNED VEHICLE CONTROL SYSTEMS

(71) Applicant: GE Aviation Systems LLC, Grand Rapids, MI (US)

(72) Inventor: Stefano Angelo Mario Lassini, Lowell, MI (US)

(73) Assignee: GE AVIATION SYSTEMS LLC, Grand Rapids, MI (US)

(*) Notice: Subject to any disclaimer, the term of this patent is extended or adjusted under 35 U.S.C. 154(b) by 528 days.

(21) Appl. No.: 15/875,481

(22) Filed: Jan. 19, 2018

(65) Prior Publication Data
US 2019/0230793 A1    Jul. 25, 2019

(51) Int. Cl.
H05K 1/14      (2006.01)
G05D 1/00      (2006.01)
B64C 39/02     (2006.01)
H03K 19/0175   (2006.01)
H05K 1/18      (2006.01)

(52) U.S. Cl.
CPC ............ H05K 1/14 (2013.01); B64C 39/024 (2013.01); G05D 1/0077 (2013.01); H03K 19/017581 (2013.01); H05K 1/18 (2013.01); B64C 2201/042 (2013.01)

(58) Field of Classification Search
USPC .......................................................... 701/3
See application file for complete search history.

(56) References Cited

U.S. PATENT DOCUMENTS

| | | | |
|---|---|---|---|
| 8,004,855 B2 | 8/2011 | Salama et al. | |
| 8,015,390 B1* | 9/2011 | Corcoran | G06F 11/1641 712/12 |
| 9,268,938 B1* | 2/2016 | Aguayo Gonzalez | G01R 21/00 |
| 10,423,158 B1* | 9/2019 | Hadlich | B64C 39/024 |
| 2006/0164261 A1* | 7/2006 | Stiffler | G01C 23/00 340/945 |
| 2007/0032920 A1* | 2/2007 | Dapp | G05D 1/0088 701/3 |
| 2007/0069083 A1* | 3/2007 | Shams | G05D 1/101 244/195 |
| 2008/0123552 A1 | 5/2008 | Slaton | |
| 2011/0035149 A1* | 2/2011 | McAndrew | G05D 1/0038 701/466 |
| 2015/0041104 A1 | 2/2015 | De Bock et al. | |

(Continued)

OTHER PUBLICATIONS

Co-Pending U.S. Appl. No. 15/875,275, filed Jan. 19, 2018.

(Continued)

Primary Examiner — Tyler D Paige
(74) Attorney, Agent, or Firm — Dority Manning, P A.

(57) ABSTRACT

A control system for an unmanned vehicle (UV) comprises a housing defining an interior, a first circuit board disposed within the interior, and a second circuit board disposed within the interior. The first circuit board includes one or more processing circuits including a first processing system and a second processing system having heterogeneous field programmable architectures. The second circuit board includes a plurality of interface circuits associated with a plurality of vehicle devices of the UV. The second circuit board is in operative communication with the first circuit board and includes an input/output (I/O) interface between the plurality of interface circuits and the first and second processing systems.

19 Claims, 14 Drawing Sheets

(56) References Cited

U.S. PATENT DOCUMENTS

| | | | | |
|---|---|---|---|---|
| 2015/0068703 | A1* | 3/2015 | de Bock | B64D 13/00 |
| | | | | 165/41 |
| 2016/0187882 | A1* | 6/2016 | Downey | G05D 1/101 |
| | | | | 701/7 |
| 2016/0321148 | A1* | 11/2016 | Lassini | B64C 13/505 |
| 2017/0285627 | A1* | 10/2017 | Feldmann | B64C 39/024 |
| 2019/0041823 | A1* | 2/2019 | Yan | G05B 19/0421 |
| 2019/0227538 | A1* | 7/2019 | Lassini | G06F 11/3013 |
| 2019/0227548 | A1* | 7/2019 | Lassini | G08G 5/0069 |
| 2019/0227826 | A1* | 7/2019 | Taylor | G06F 9/5077 |
| 2019/0228666 | A1* | 7/2019 | Lassini | G05D 1/0088 |
| 2019/0230793 | A1* | 7/2019 | Lassini | H05K 1/18 |
| 2019/0230801 | A1* | 7/2019 | Neuman | H05K 5/0247 |
| 2019/0230822 | A1* | 7/2019 | Neuman | H05K 5/0017 |

OTHER PUBLICATIONS

Co-Pending U.S. Appl. No. 15/875,305, filed Jan. 19, 2018.
Co-Pending U.S. Appl. No. 15/875,325, filed Jan. 19, 2018.
Co-Pending U.S. Appl. No. 15/875,350, filed Jan. 19, 2018.
Co-Pending U.S. Appl. No. 15/875,381, filed Jan. 19, 2018.
Co-Pending U.S. Appl. No. 15/875,429, filed Jan. 19, 2018.
Co-Pending U.S. Appl. No. 15/875,454, filed Jan. 19, 2018.
European Search Report Corresponding to Application No. 19150595 dated Jun. 7, 2019.
Canadian Office Action Corresponding to Application No. 3029561 dated Dec. 18, 2019.
Vanderleest, MPSoC Hypervisor: The Safe & Secure Future of Avionics, DornerWorks, Embedded Systems Engineering, DASC 2015, Prague, 25 pages.
1-Core Technologies, FPGA Architectures Overview, Downloaded Jan. 3, 2018, https://www.pdx.edu/nanogroup/sites/www.pdx.edu.nanogroup/files/FPGA-architecture.pdf, 2 pages.
Vectornav Technologies, Embedded Navigation Solutions, Industrial Series, 2017, 6 pages.
Microsemi, Power Matters, Microcontroller Based FPGA's Hit the Mark, WP0205 White Paper, Jan. 2016, 6 pages.
Microsemi, Power Matters, FPGA and SoC Product Catalog, Lowest Power, Proven Security, and Exceptional Reliability, 2016, 28 pages.
Microsemi, Power Matters, AC400 Application Note, SmartFusion2 SoC FPGA Flash*Freeze Entry and Exit-Libero SoC v11.8, 2017, 23 pages.
Xilinx, Xynq UltraScale+ MPSoC Product Tables and Product Selection Guide, 2016-2017, 16 pages.

* cited by examiner

UNMANNED VEHICLE CONTROL SYSTEMS

FIELD

The present disclosure relates generally to unmanned vehicles, and more particularly to control systems for unmanned vehicles.

BACKGROUND

An unmanned vehicle (UV) is a vehicle having no onboard pilot. Typically, UVs such as unmanned aerial vehicles (UAVs) are controlled remotely by a pilot, by onboard control systems, or by a combination of a remote pilot and onboard control system. Most unmanned aerial vehicles include a control system to control vehicle operations. Often, a control system for a UAV includes one or more vehicle control systems including onboard navigation systems such as inertial navigation systems and satellite navigation systems. Unmanned aerial vehicles may use inertial navigation sensors such as accelerometers and gyroscopes for flight positioning and maneuvering and satellite-based navigation for general positioning and wayfinding. Most control systems additionally include one or more mission control systems for performing one or more mission control functions, such as capturing images or delivering a payload. Typically, individual hardware components are provided onboard a UAV for each vehicle control system and each mission control system.

BRIEF DESCRIPTION

Aspects and advantages of the disclosed technology will be set forth in part in the following description, or may be obvious from the description, or may be learned through practice of the disclosure.

According to example aspects of the present disclosure, there is provided a control system for an unmanned vehicle (UV). The control system comprises a housing defining an interior, a first circuit board disposed within the interior and including one or more processing circuits, and a second circuit board disposed within the interior and in operative communication with the first control board. The one or more processing circuits include a first processing system and a second processing system having heterogeneous field programmable architectures. The second circuit board includes a plurality of interface circuits associated with a plurality of vehicle devices of the UV and an input/output (I/O) interface between the plurality of interface circuits and the first and second processing systems.

According to example aspects of the present disclosure, there is provided a control system for an unmanned vehicle (UV), comprising a housing defining an interior, a first circuit board disposed within the interior, and a second circuit board disposed within the interior. The first circuit board includes a first input/output connector, a first integrated circuit comprising a first processing system, and a second integrated circuit comprising a second processing system. The first processing system includes a first processing unit and a RAM-based programmable logic array. The second processing system includes a second processing unit and a flash-based programmable logic array. The second circuit board includes a second input/output connector connected to the first input/output connector and a third input/output connector extending from the housing. The second circuit board includes a plurality of interface circuits in operative communication with a plurality of sensor connectors of the second circuit board.

According to example aspects of the present disclosure, there is provided a control system for an unmanned vehicle (UV), comprising a housing defining an interior, a control module disposed within the interior, and a carrier module disposed within the interior. The control module includes a first processing system and a second processing system having heterogeneous field programmable architectures. The second processing system is configured to control a first vehicle device of the UV based on execution of a first process by the first processing system and execution of a second process by the second processing system. The carrier module includes one or more interface circuits configured to provide an input/output (I/O) interface between the first vehicle device of the UV and the control module.

These and other features, aspects and advantages of the disclosed technology will become better understood with reference to the following description and appended claims. The accompanying drawings, which are incorporated in and constitute a part of this specification, illustrate embodiments of the disclosed technology and, together with the description, serve to explain the principles of the disclosed technology.

BRIEF DESCRIPTION OF THE DRAWINGS

A full and enabling disclosure of the present disclosure, including the best mode thereof, directed to one of ordinary skill in the art, is set forth in the specification, which makes reference to the appended figures, in which.

DETAILED DESCRIPTION

Figure 1:
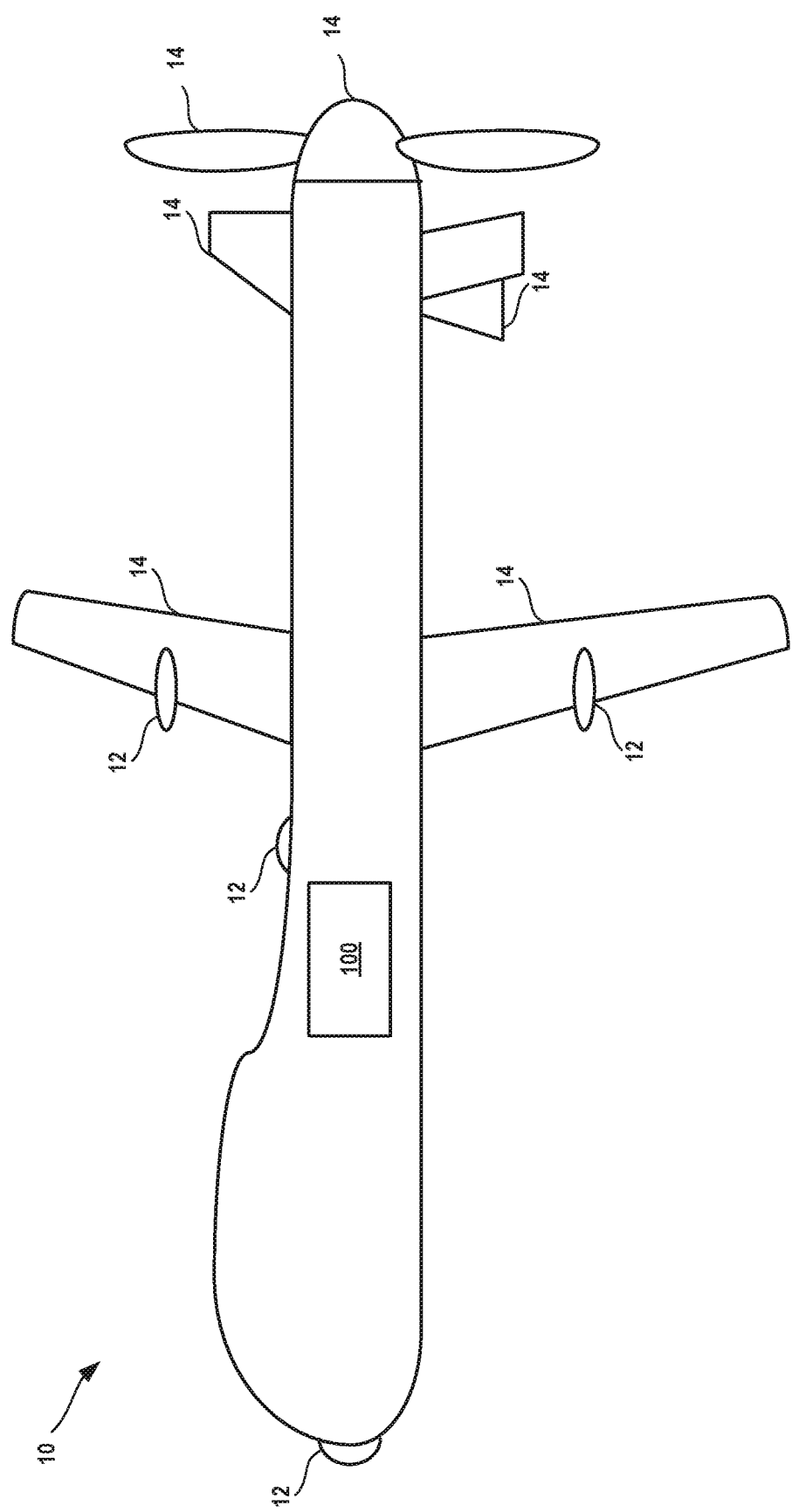
FIG. 1 is a block diagram depicting an example of an unmanned aerial vehicle (UAV) in which embodiments of the present disclosure may be practiced.

Reference now will be made in detail to embodiments of the disclosure, one or more examples of which are illustrated in the drawings. Each example is provided by way of explanation, not limitation of the disclosed embodiments. In fact, it will be apparent to those skilled in the art that various modifications and variations can be made in the present disclosure without departing from the scope or spirit of the claims. For instance, features illustrated or described as part of example embodiments can be used with another embodiment to yield a still further embodiment. Thus, it is intended that the present disclosure covers such modifications and variations as come within the scope of the appended claims and their equivalents.

As used in the specification and the appended claims, the singular forms "a," "an," and "the" include plural referents unless the context clearly dictates otherwise. The use of the term "about" in conjunction with a numerical value refers to within 25% of the stated amount.

Example aspects of the present disclosure are directed to systems and methods for controlling unmanned vehicles (UV), and more particularly, to systems and methods for controlling unmanned vehicles and vehicle devices of the unmanned vehicles using a control system to provide integrated vehicle and mission management control. In example embodiments, the control system includes a housing defining an interior and one or more circuit boards disposed within the interior. More particularly, the control system can include a first circuit board having one or more integrated circuits that provide a first processing system and a second processing system. In example embodiments, the first and second processing systems have heterogeneous field programmable gate array architectures to provide diverse, configurable, and certifiable UV applications.

In some examples, the first circuit board forms a control module for a control box and is configured to control vehicle and mission functions for a UV. For example, the second processing system can control a first vehicle device or function of the UV based on execution of a first mission or vehicle control process by the first processing system and execution of a second mission or vehicle control process by the second processing system.

The control system can additionally include a second circuit board disposed within the interior. The second circuit board may have one or more additional integrated circuits and provide an interface between the additional integrated circuits and the first and second processing systems. In example embodiments, the integrated circuits of the second circuit board are interface circuits such as communication interface circuits that are adapted for coupling to vehicle devices via a plurality of sensor connectors of the second circuit board. The vehicle devices may include propulsion and movement devices, control surfaces, and sensors.

In some examples, the interface circuits can receive outputs of the via the sensor connectors and provide vehicle device data to the first circuit board based on the device outputs. In some implementations, the first circuit board includes a first input/output (I/O) connector that is coupled to a second I/O connector at the second circuit board. The second circuit board may additionally include a third I/O connector that extends from the housing of the control system. In some examples, the second circuit board is a carrier module configured to provide an I/O interface between vehicle devices of the UV in a first circuit board such as a control module.

In various embodiments, the first circuit board may be configured to execute a plurality of vehicle control processes as well as a plurality of mission control processes. Additionally, the second circuit board can be configured to provide an I/O interface between the UV and these vehicle control processes and mission control process.

In example embodiments, the first processing system can include one or more first processing units and a volatile programmable logic array such as a RAM based field programmable gate array. The second processing system can include one or more second processing units and a nonvolatile programmable logic array such as a flash-based field programmable gate array. In some implementations, the flash-based field programmable gate array manages control of one or more vehicle devices of the UV based on a first vehicle process executed by the one or more first processing units and a second vehicle process executed by the one or more second processing units.

In some examples, the first circuit board includes a first integrated circuit comprising the first processing system and a second circuit board comprising the second processing system. Each processing system may include one or more processing units such as central processing units (CPU), application processing units (APU), real-time processing units (RPU), co-processing processing units, and graphics processing units (GPU). Additionally, each integrated circuit may include an embedded programmable logic array such as a field programmable gate array (FPGA) forming an integrated part of the respective processing system.

In some examples, the first processing system and/or the second processing system may each be provided as a multi-processing core system-on-a-chip. Together, two or more systems on chip configured with processing systems as described may provide a heterogeneous processing system for a UV.

In example embodiments of the disclosed technology, the first processing system and the second processing system cooperate to provide more reliable, robust, and/or certifiable UV applications. For example, the first processing system of the first circuit board can be configured to execute a first process for the UV. The first process may be associated with a first vehicle device of the UV. The second processing system can be configured to monitor execution of the first process by the first processing system. Similarly, the first processing system can be configured to monitor execution of a process by the second processing system.

More particularly, in some examples one or more first processing units of the first processing system can be configured to execute a plurality of vehicle management processes. A volatile programmable logic array of the first processing system can be configured to execute a plurality of mission control processes. The nonvolatile programmable logic array of the second processing system can be configured to monitor execution of one or more of the vehicle control processes by the one or more first processing units.

In some examples, the second processing system is configured to initiate one or more control actions based on monitoring execution of the process by the first processing system. For example, the nonvolatile programmable logic array of the second processing system can be configured to monitor an output associated with the first processing system. In response to detecting an invalid output, the second processing system can initiate a control action. By way of example, the nonvolatile programmable logic array may restart at least a portion of the first processing system based on an invalid output. In another example, the logic array of the second processing system may restart one or more processes by the first processing system. An invalid output may include a lack of an output from a process or processing system, such as may occur when a process or processing system faults, as well as unexpected signals or values provided as an output.

In some implementations, the second processing system can be configured to transfer control of one or more UV functions based on monitoring the first processing system. For example, the second processing system may detect an invalid output associated with a first process executed by the first processing system. In response, the second processing system may transfer control of a function or device associated with the first process to a second process. For instance, the second processing system may transfer control of a UV device or an autopilot function from the first processing system to the second processing system. In some examples, the second processing system can be configured to execute the second process in response to detecting the invalid output.

Embodiments of the disclosed technology provide a number of technical benefits and advantages, particularly in the area of unmanned vehicles such as unmanned aerial vehicles. As one example, the technology described herein enables control of an unmanned vehicle (UV) using compact and lightweight electronic solutions. Circuit boards having integrated heterogeneous processing systems enable reduced hardware implementations that provide multiple vehicle control processes and mission management processes for a UV. Additionally, such solutions provide backup functions and multiple fail point implementations that can meet the high certification requirements of airborne applications. Moreover, the integration of such heterogeneous processing systems into a housing with one or more circuit boards that provide input/output (I/O) interfaces further enables reduced space and weight requirements.

Embodiments of the disclosed technology also provide a number of technical benefits and advantages in the area of computing technology. For example, the disclosed system can provide diverse computing environments to meet the various demands of UV applications. Multiple processing units spread across multiple integrated circuits provide a range of high speed processing options for application integration. Vehicle and mission control processes can be allocated to various hardware and/or software partitions according to criticality and performance needs. Moreover, embedded field programmable gate arrays tightly coupled to these processing units via integration on a single integrated circuit with corresponding processing units provides additional diversity and reliability.

FIG. 1 is a schematic view of an example unmanned aerial vehicle (UAV) UAV 10. UAV 10 is a vehicle capable of flight without an onboard pilot. For example, and without limitation, UAV 10 may be a fixed wing aircraft, a tilt-rotor aircraft, a helicopter, a multirotor drone aircraft such as a quadcopter, a blimp, a dirigible, or other aircraft.

UAV 10 includes a plurality of vehicle devices including at least one propulsion and movement (PM) device 10. A PM device 14 produces a controlled force and/or maintains or changes a position, orientation, or location of UAV 10. A PM device 14 may be a thrust device or a control surface. A thrust device is a device that provides propulsion or thrust to UAV 10. For example, and without limitation, a thrust device may be a motor driven propeller, jet engine, or other source of propulsion. A control surface is a controllable surface or other device that provides a force due to deflection of an air stream passing over the control surface. For example, and without limitation, a control surface may be an elevator, rudder, aileron, spoiler, flap, slat, air brake, or trim device. Various actuators, servo motors, and other devices may be used to manipulate a control surface. PM device 14 may also be a mechanism configured to change a pitch angle of a propeller or rotor blade or a mechanism configured to change a tilt angle of a rotor blade.

UAV 10 may be controlled by systems described herein including, without limitation, an onboard control system including a control box 100, a ground control station (not shown in FIG. 1), and at least one PM device 14. UAV 10 may be controlled by, for example, and without limitation, real-time commands received by UAV 10 from the ground control station, a set of pre-programmed instructions received by UAV 10 from the ground control station, a set of instructions and/or programming stored in the onboard control system, or a combination of these controls.

Real-time commands can control at least one PM device 14. For example, and without limitation, real-time commands include instructions that, when executed by the onboard control system, cause a throttle adjustment, flap adjustment, aileron adjustment, rudder adjustment, or other control surface or thrust device adjustment.

In some embodiments, real-time commands can further control additional vehicle devices of UAV 10, such as one or more secondary devices 12. A secondary device 12 is an electric or electronic device configured to perform one or more secondary functions to direct propulsion or movement of the UAV. Secondary devices may be related to propulsion or movement of the UAV, but typically provide one or more vehicle or mission functions independent of direct control of vehicle propulsion or motion control. For example, secondary devices may include mission-related devices such as cameras or other sensors used for object detection and tracking. Other examples of secondary devices 12 may include sensors such as LIDAR/SONAR/RADAR sensors, GPS sensors, communication devices, navigation devices, and various payload delivery systems. For example, and without limitation, real-time commands include instructions that when executed by the onboard control system cause a camera to capture an image, a communications system to transmit data, or a processing component to program or configure one or more processing elements.

UAV 10 is depicted by way of example, not limitation. Although much of the present disclosure is described with respect to unmanned aerial vehicles, it will be appreciated that embodiments of the disclosed technology may be used with any unmanned vehicle (UV), such as unmanned marine vehicles and unmanned ground vehicles. For example, the disclosed control systems may be used with unmanned boats, unmanned submarines, unmanned cars, unmanned trucks, or any other unmanned vehicle capable of locomotion.

Figure 2:
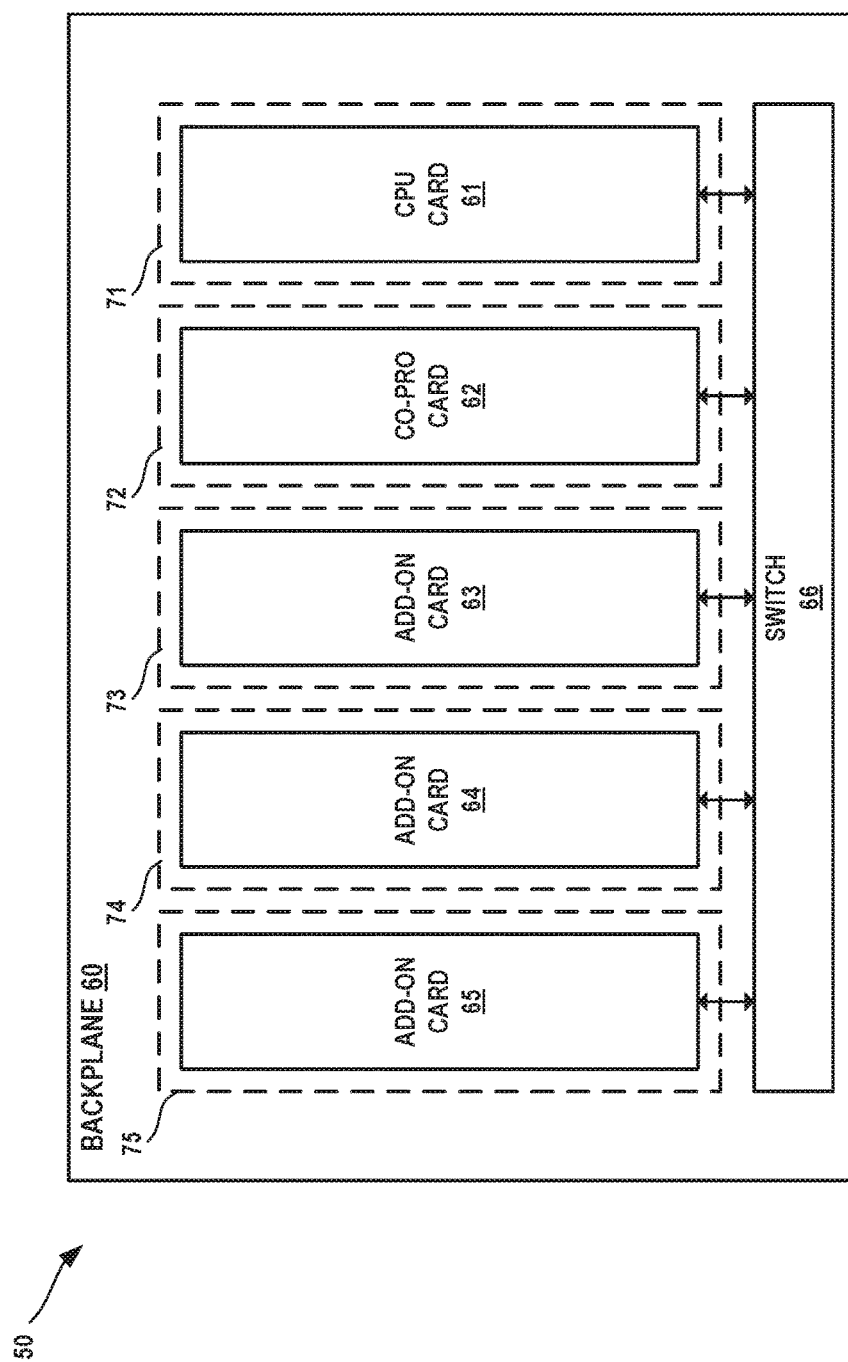
FIG. 2 is a block diagram depicting an example of a typical control system for a UAV including a backplane and card architecture.

FIG. 2 is a block diagram depicting an example of a typical control system 50 for a UAV. In this example, a control system is formed using a backplane 60 having a plurality of card slots 71, 72, 73, 74, 75. Each card slot is configured to receive a card meeting a predefined set of mechanical and electrical standards. Each card includes one or more circuit boards, typically including one or more integrated circuits configured to perform specific vehicle or mission control functions. The card slot provides structural support for the card, as well as an electrical connection between the card and an underlying bus. A particular example is depicted having a CPU card 61 installed in a first card slot 71, a co-processor card 62 installed in a second card slot 72, and add-on cards 63, 64, 65 installed in card slots 73, 74, 75, respectively. By way of example, CPU card 61 may include a circuit board having a processor, PCI circuitry, switching circuitry, and an electrical connector configured to both structurally and electrically connect card 61 to card slot 71. Similarly, co-processor card 62 may include a processor, PCI circuitry, switching circuitry, and a connector.

Add-on cards 63, 64, 65 may include any number and type of cards configured to perform one or more vehicle and/or mission functions. Examples of add-on cards include input/output (I/O) cards, network cards, piloting and navigation function cards, sensor interface cards (e.g., cameras, radar, etc.), payload delivery systems control cards, graphics processing unit (GPU) cards, and any other card for a particular type of vehicle and/or mission function.

Typical backplane architectures like that in FIG. 2 include a switch 66 that allows each card to communicate with cards in any other slot. Numerous examples including various standards exist to define different types of backplane architectures. For example, although switch 66 is shown separate from the card slots 71, 72, 73, 74, 75, some architectures may place a central switch in a particular slot of the backplane. In each case, the node devices can communicate with one another via the switch.

While five card slots are depicted in FIG. 2, a backplane may include any number of card slots.

An onboard control system for a UAV utilizing a backplane architecture like that of FIG. 2 may be effective in providing some function control. Additionally, such an architecture may provide some configurability through hardware changes. However, traditional backplane architectures may have a number of drawbacks in implementations for UAVs. For example, the structural performance of a backplane coupling to a plurality of cards through a combined electrical and mechanical connection may not be well-suited to the high-stress environments of some UAVs. Mechanical and/or electrical failures may occur for one or more cards in the backplane due to vibrations, temperatures, and other factors. Additionally, such architectures provide a limited processing capability, while requiring considerable space and weight. Each card typically includes its own circuit board including connectors, switching circuitry, communication circuitry, etc. Because each circuit board requires its own circuitry for these common functions, a backplane architecture may provide relatively high weight and space requirements. Moreover, the computing ability and capacity of these types of systems is typically limited by a multiple card approach. Communication between the cards, and between the various processing elements may lead to reduced computational abilities.

Figure 3:
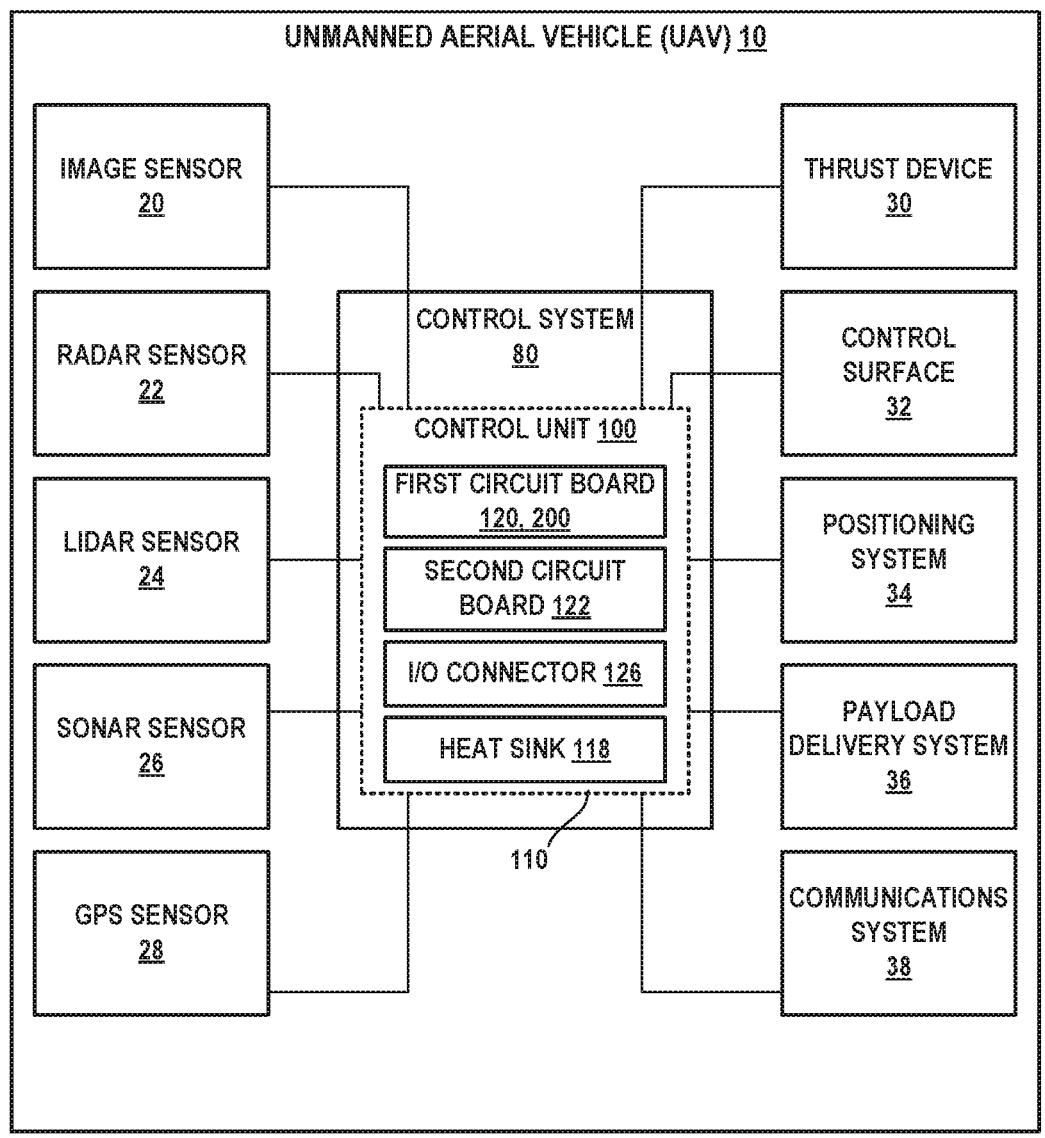
FIG. 3 is a block diagram depicting an example of a UAV having an onboard control system according to example embodiments of the present disclosure.

FIG. 3 is a block diagram depicting an unmanned aerial vehicle (UAV) 10 including a control system 80 in accordance with embodiments of the disclosed technology. Control system 80 includes a control box 100 that provides centralized control of vehicle and mission functions. The control box includes a housing 110 defining an interior. A first circuit board 120 and second circuit board 122 are disposed within the interior of housing 110, and an I/O connector 126 extends from the second circuit board 122 through the housing 110 as described hereinafter. Control box 100 includes a heat sink 118 provided to dissipate heat from the electric components of the control box 100. In example embodiments, heat sink 118 may form at least a portion of housing 110 as described hereinafter. Control system 80 may include additional components such as additional control units or other elements that perform vehicle or mission control processes.

In some implementations, first circuit board 120 comprises a control module for controlling vehicle and mission control processes of UAV 103, and second circuit board 122 comprises a carrier module for providing a communication interface between the control unit and various PM devices and secondary devices of the UAV.

In some examples, the first circuit board includes multiple heterogeneous processing systems, each having a reconfigurable processing architecture to provide management of the various vehicle and mission functions. The multiple heterogeneous processing systems with reconfigurable functionality are suited to the diverse functions performed by unmanned airborne vehicles, as well as the high level of certifications typically needed for these vehicles.

In example embodiments, the second circuit board 122 is a carrier module providing an interface between the first circuit board 120 and the various PM devices and secondary devices of UAV 10. For example, FIG. 3 depicts a set of PM devices including a thrust device 30, control surface 32, and positioning system 34. Additionally, FIG. 3 depicts a set of secondary devices including an image sensor 20, a radar sensor 22, a LIDAR sensor 24, a sonar sensor 26, a GPS sensor 28, a payload delivery system 36, and a communication system 38. The second circuit board 122 may include an I/O connector that connects to a corresponding I/O connector of the first circuit board, as well as an I/O connector that extends from the housing. Additionally, the second circuit board may include a plurality of sensor connectors that extend from the housing. The second circuit board may provide a communications or input/output (I/O) interface including associated electronic circuitry that is used to send and receive data. More specifically, the communications interface can be used to send and receive data between any of the various integrated circuits of the second circuit board, and between the second circuit board and other circuit boards. For example, the item interface may include I/O connector 126, I/O connector 238, and/or I/O connector 124. Similarly, a communications interface at any one of the interface circuits may be used to communicate with outside components such as another aerial vehicle, a sensor, other vehicle devices, and/or ground control. A communications interface may be any combination of suitable wired or wireless communications interfaces.

In some examples, control box 100 may include additional components. For example, a third circuit board such as a mezzanine card can be provided within control box 100 in another embodiment. The third circuit board may include one or more nonvolatile memory arrays in some examples. For example, a solid-state drive (SSD) may be provided as one or more integrated circuits on a mezzanine card. Moreover, control box 100 may include additional circuit boards to form a control module as well as additional circuit boards to form additional carrier modules.

Figure 4:
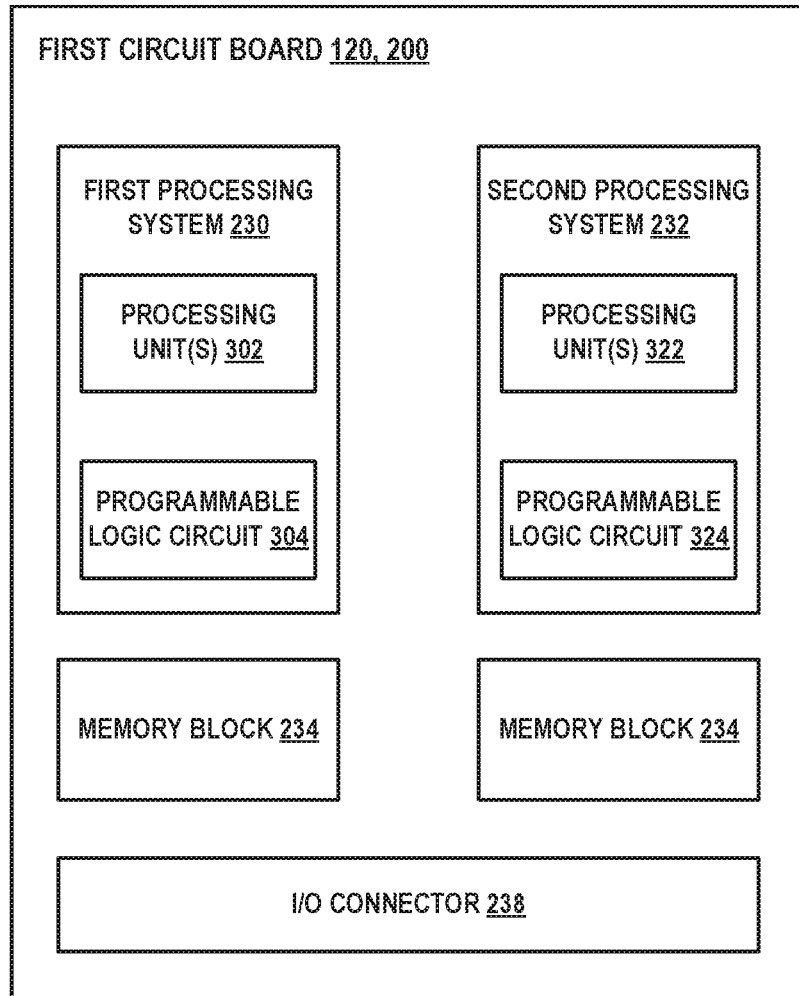
FIG. 4 is a block diagram depicting a first circuit board comprising a control module for a control box of the onboard control system according to example embodiments of the present disclosure.

FIG. 4 is a block diagram describing a first circuit board 120 in accordance with example embodiments of the disclosed technology. In FIG. 4, first circuit board 120 is configured as a control module (e.g., control board) for an unmanned aerial vehicle (UAV). In example embodiments, first circuit board 120 is a system-on-module (SOM) card. First circuit board 120 includes a first processing system 230, second processing system 232, memory blocks 234, and an I/O connector 238.

The first and second processing systems can include or be associated with, any suitable number of individual microprocessors, power supplies, storage devices, interfaces, and other standard components. The processing systems can include or cooperate with any number of software programs (e.g., vehicle and mission control processes) or instructions designed to carry out the various methods, process tasks, calculations, and control/display functions necessary for operation of the aerial vehicle 10. Memory blocks 234 may include any suitable form of memory such as, without limitation, SDRAM, configured to support a corresponding processing system. For example, a first memory block 234 may be configured to support first processing system 230 and a second memory block 234 may be configured to support second processing system 232. Any number and type of memory block 234 may be used. By way of example, four memory blocks each comprising an individual integrated circuit may be provided to support the first processing system 230 and two memory blocks may be provided to support the second processing system 232.

I/O connector 238 extends from a first surface of first circuit board 122 to provide an operative communication link to second circuit board 122.

First processing system 230 and second processing system 232 form a heterogeneous and reconfigurable computing architecture in example embodiments of the disclosed technology, suitable to the diverse and stable needs of UAV 10. First processing system 230 includes one or more processing units 302 forming a first processing platform and one or more programmable logic circuits 304 forming a second processing platform. By way of example, one or more processing units 302 may include a central processing unit and programmable logic circuit 304 may include a volatile programmable logic array such as a RAM-based field programmable gate array (FPGA). Any number and type of processing unit may be used for processing units 302. Multiple processing units 302 and programmable logic circuit 304 may be provided within a first integrated circuit, referred to generally as a processing circuit in some embodiments.

Second processing system 232 includes one or more processing units 322 forming a third processing platform and one or more programmable logic circuits 324 forming a fourth processing platform. By way of example, one or more processing units 302 may include a co-processing unit and programmable logic circuit 324 may include a flash-based FPGA. Any number and type of processing unit may be used for processing units 324. One or more processing units 324 and programmable logic circuit 324 may be provided within the second integrated circuit, also referred to as a processing circuit in some embodiments.

Figure 5:
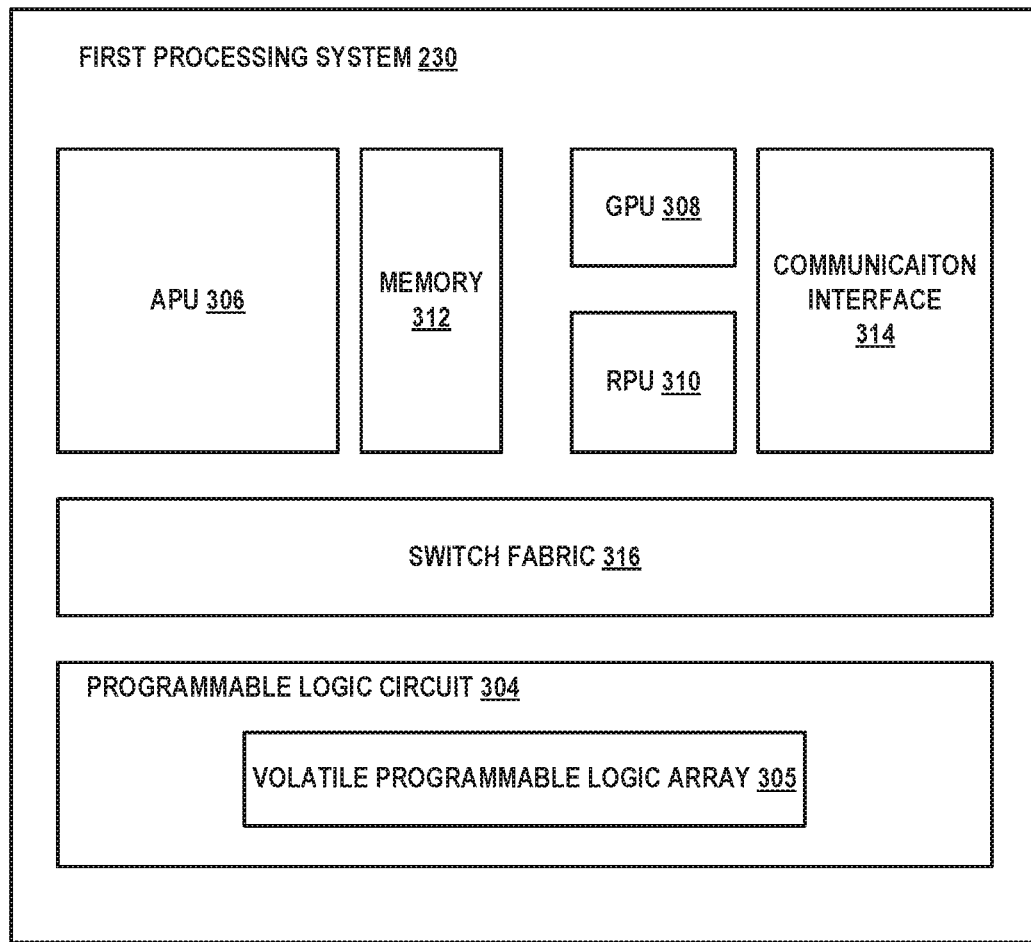
FIG. 5 is a block diagram depicting a first processing system of the first circuit board according to example embodiments of the present disclosure.

By providing different processing unit types as well as different programmable logic circuit types in each processing system, first circuit board 120 provides a heterogeneous computing system uniquely suited to the processing, reliability, and operational requirements of high-stress application UAVs. For example, the RAM-based and flash-based FPGA technologies are combined to leverage the strengths of both for UAV applications. The unique abilities of heterogeneous processing units 302 and 322 and heterogeneous programmable logic circuits 304 and 324 support both hardware and software-partitioned operating environments. Vehicle and mission management functions can be allocated to different partitions according to criticality and performance needs. This provides a control and monitor architecture suitable for critical operations. For example, an on/off or red/green architecture for control of irreversible critical functions is provided. By way of further example, one or more of the field programmable gate arrays may be configured to provide a fabric accelerator for onboard sensor processing FIG. 5 is a block diagram describing additional details of first processing system 230 in accordance with example embodiments of the disclosed technology. In FIG. 5, first processing system 230 includes three processing units 302 as described in FIG. 4. More particularly, first processing system 230 includes an application processing unit (APU) 306, a graphics processing unit (GPU) 308, and a real-time processing unit (RPU) 310. Each of processing units 306, 308, 310 may be supported by memory 312 which may include any number and type of memory such as an SDRAM. Each processing unit is implemented on an individual integrated circuit referred to as a processing circuit. In one example, APU 306 is formed on a first processing circuit and includes a quad core processing unit comprising four processors. RPU 310 is formed on a third processing circuit and includes a dual core processing unit comprising two processors. GPU 308 is formed on a fourth processing circuit and includes a single core processing unit. A second processing unit is provided for the second processing system as described below. A switch fabric 316 connects the various components of processing system 230. Switch fabric 316, for example, may include a low-power switch and a central switch in some examples. Communication interface 314 couples first processing system 232 to first circuit board 120.

Programmable logic circuit 304 includes a volatile programmable logic array 305. In example embodiments, logic array may include a RAM-based programmable logic array such as a RAM-based floating point gate array including RAM logic blocks or memory cells. Volatile programmable logic array 305 can be programmed with configuration data provided to the first processing system through communication interface 314. For example, a RAM-based FPGA can store configuration data in the static memory of the array, such as in an organization comprising an array of latches. The logic blocks are programmed (configured) when programmable logic circuit 304 is started or powered up. The configuration data can be provided to logic array 305 from an external memory (e.g., nonvolatile memory of first circuit board 120 or a mezzanine board as described hereinafter) or from an external source of UAV 10 (e.g., using second circuit board 122). A RAM-based FPGA provides high levels of configurability and re-configurability. Although not shown, logic array 305 may include various programmed circuits such as ethernet interfaces and PCI interfaces, and the various vehicle and mission management processes described herein.

Figure 6:
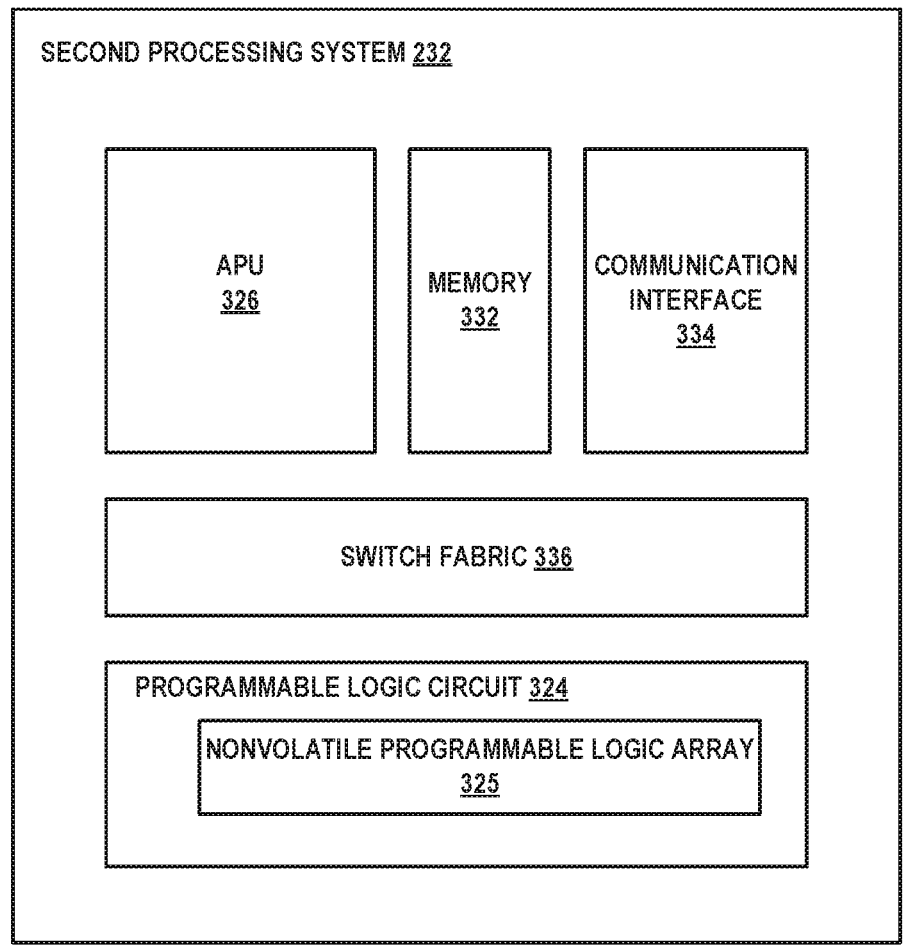
FIG. 6 is a block diagram depicting a second processing system of the first circuit board according to example embodiments of the present disclosure.

FIG. 6 is a block diagram describing additional details of second processing system 232 accordance with example embodiments of the disclosed technology. In FIG. 6, second processing system 232 includes an application processing unit (APU) 326 and memory 332. In one example, APU 326 is formed on a second processing circuit and includes a quad core processing unit comprising four processors. Memory 332 may include any number and type of memory such as SDRAM. A switch fabric 336 connects the various components of processing system 232. Communications interface 334 couples first processing system 232 to first circuit board 120.

Programmable logic circuit 324 includes a nonvolatile programmable logic array 325. In example embodiments, logic array 325 may include a flash-based programmable logic array such as a flash-based floating point gate array including flash logic blocks or memory cells. Nonvolatile programmable logic array 325 can be programmed with configuration data provided to the second processing system through communication interface 334. For example, a flash-based FPGA can store configuration data in the nonvolatile memory of the array. Flash memory is used as the primary resource for storage of the configuration data such that RAM-based memory is not required. Because the configuration data is stored within the nonvolatile memory, there is no requirement for reading the configuration data to the logic array upon startup or power up. As such, the flash-based logic array may execute applications immediately upon power up. Moreover, external storage of configuration data is not required. The flash-based logic array can be reprogrammed or reconfigured by providing updated configuration data to override the configuration data presently stored in the logic array. The flash-based logic array may consume less power than the RAM-based logic array, as well as provide more protection against interference. Although not shown, logic array 325 may include various programmed circuits, such as for the various vehicle and mission management processes described herein. In one example, logic array 325 may include at least one FPGA fabric accelerator for onboard sensor processing.

Figure 7:
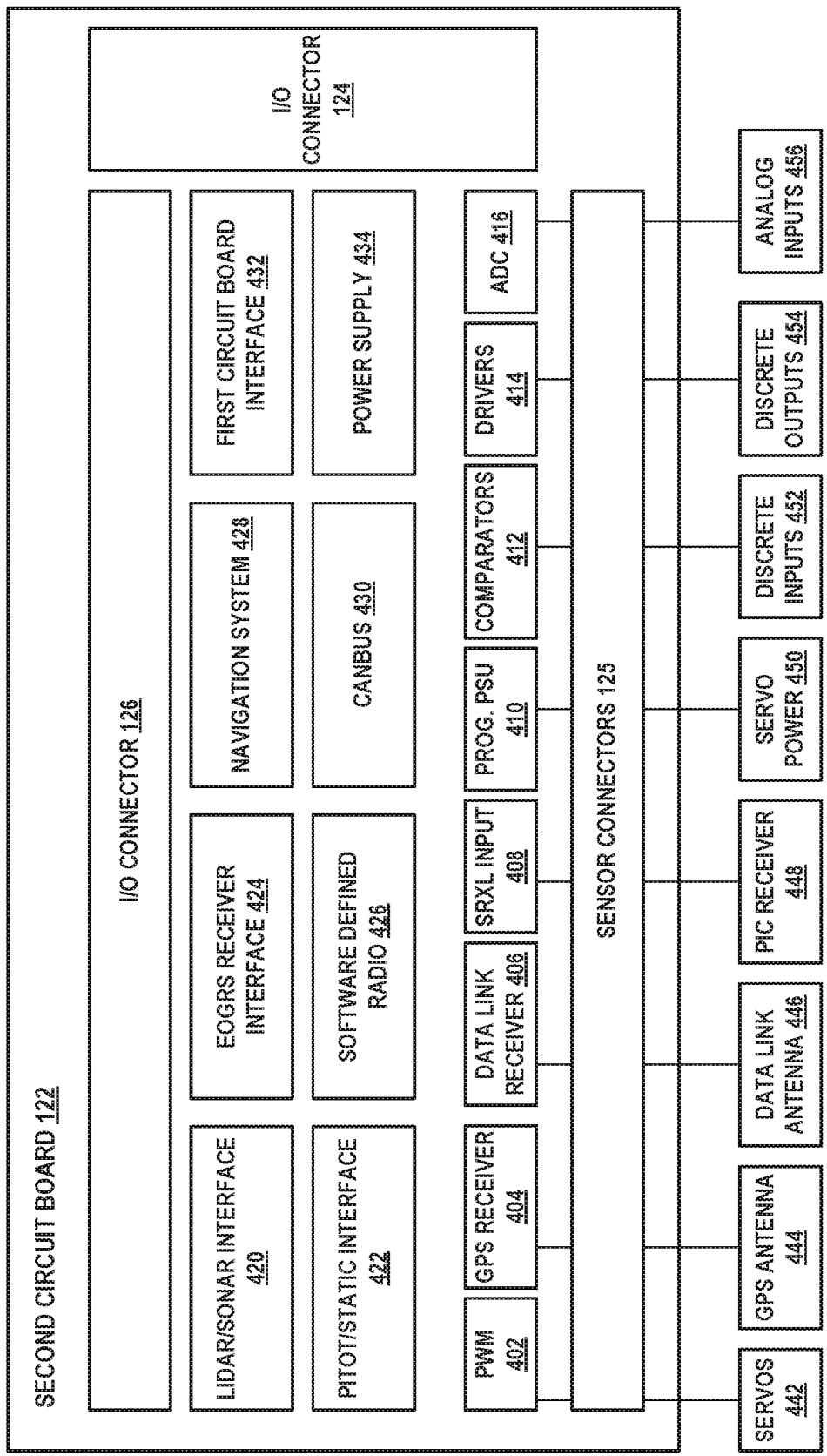
FIG. 7 is a block diagram depicting a second circuit board comprising a carrier module for the control box according to example embodiments of the present disclosure.

FIG. 7 is a block diagram depicting additional details of second circuit board 122 in accordance with example embodiments of the disclosed technology. In FIG. 7, second circuit board 122 is configured as a carrier module (e.g., carrier card) for an unmanned aerial vehicle (UAV). Second circuit board 122 includes a plurality of integrated circuits such as interface circuits providing I/O capabilities for control box 100. The interface circuits are configured to receive outputs of the plurality of vehicle devices of the UAV via the sensor connectors. The interface circuits provide vehicle device data based on outputs of the vehicle devices to the first circuit board via I/O connector 124. Second circuit board 122 includes an I/O connector 126 that extends from a housing of control unit 100 to provide an operative communication link to PM devices and secondary devices of UAV 10. Additionally, second circuit board 122 includes an I/O connector 124 extending from a first surface of second circuit board 122 to provide an operative communication link to first circuit board 120. Although not shown, second circuit board 122 may include an additional I/O connector for coupling to a mezzanine card including a solid-state drive, for example. Any one or a combination of I/O connectors 126, 124, and 228 may form an I/O interface between the interface circuits of the second circuit board and the first and second processing systems of the first circuit board.

FIG. 7 describes a particular set of interface circuits as may be used in the particular implementation of control box 100. It will be appreciated, however, that any number and type of interface circuit may be used as suited for a particular implementation. Second circuit board 122 includes a plurality of interface circuits such as a LIDAR/SONAR interface 420, a Pitot/static interface 422, an electro-optical grid reference system (EOGRS) receiver interface 424, and a first circuit board interface 432 for communicating with first circuit board 122. Second circuit board 122 also includes interface circuits such as a software defined radio 426, a navigation system 125, a controller area network bus (CANBUS) 430, and a power supply 434. In some embodiments, navigation system 428 is an integrated circuit providing an integrated navigation sensor suite, including various sensors such as inertial measurement sensors. Additionally, second circuit board 122 includes a number of interface circuits in operative communication with a plurality of vehicle devices (e.g., PM devices or secondary devices) of the UAV 10. A plurality of sensor connectors 458 extend from the housing of control unit 100 for coupling to the vehicle devices of UAV 10.

In the specific example of FIG. 7, one or more pulse width modulators (PWM) 402 are in operative communication with one or more servos 442 via a first sensor connector 458. Although a PWM servo command interface is depicted, other types of servo command interfaces may be used. For example, analog voltage, current loop, RS-422, RS-485, MIL-STD-1553 are all examples of possible servo control signals. A GPS receiver 404 is in operative communication with one or more GPS antennas 444 via a second sensor connector 458. GPS antennas 444 are one example of a GPS sensor 28. A datalink receiver 406 is in operative communication with one or more datalink antennas 446 via a third sensor connector 458. A serial receiver link (SRXL) input 408 is in operative communication with a Pilot in Command (PIC) receiver 448 via a fourth sensor connector 458. A programmable power supply unit (PSU) 410 is in operative communication with a servo power 450 via a fifth sensor connector 458. One or more comparators 412 are in operative communication with one or more discrete inputs 452 via a sixth sensor connector 458. One or more drivers 414 are in operative communication with one or more discrete outputs 454 via a seventh sensor connector 458. One or more analog-to-digital converters (ADC) 416 are in operative communication with one or more analog inputs 456 via an eighth sensor connector 458.

Figure 8:
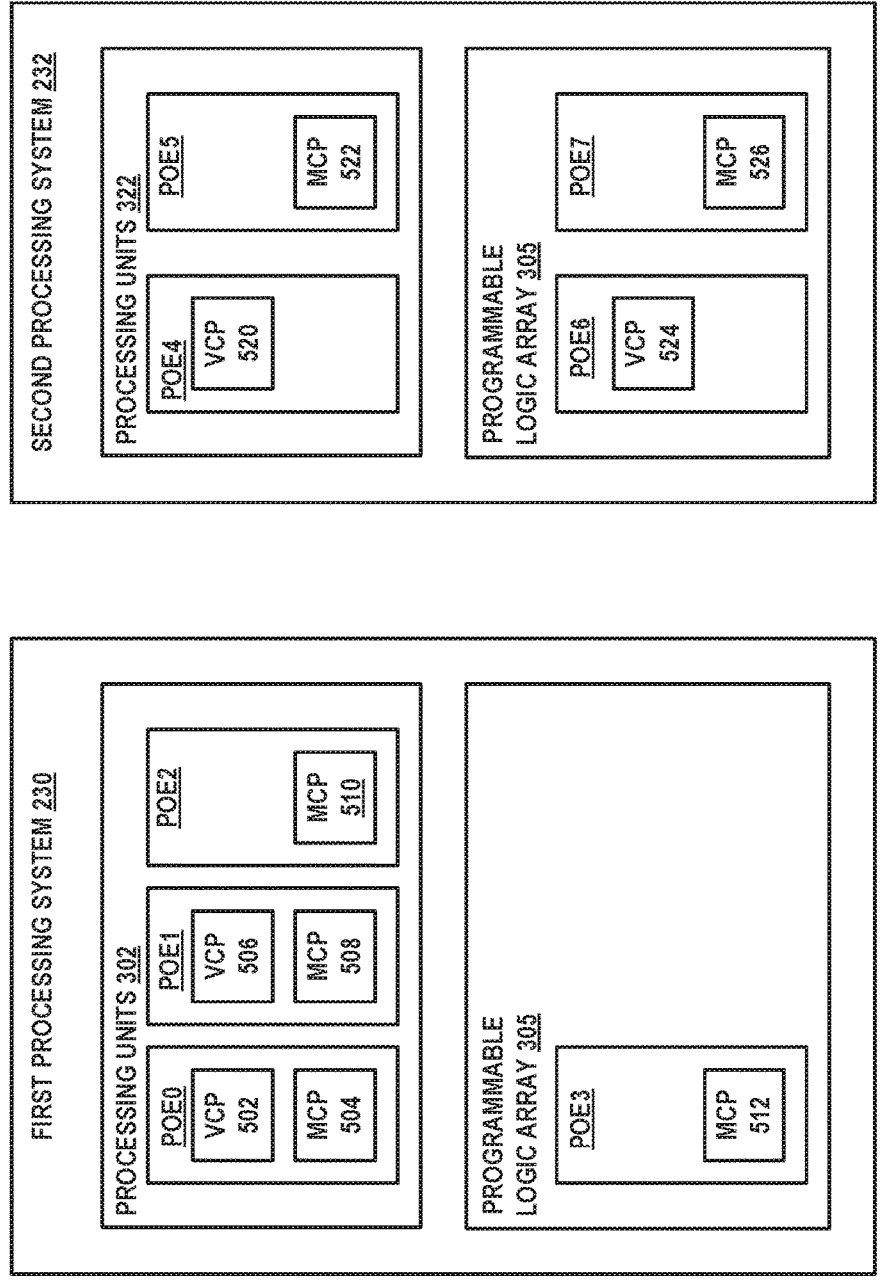
FIG. 8 is a block diagram depicting an example of partitioned operating environments for a heterogeneous processing system according to example embodiments of the present disclosure.

FIG. 8 is a block diagram depicting an example of first circuit board 120 in accordance with embodiments of the disclosed technology. FIG. 8 depicts a specific implementation of first circuit board 120, as may be configured for a particular flight or mission. FIG. 8 depicts first processing system 230 second processing system 232 as previously described. For clarity of description, only a subset of the components of processing systems 230 and 232 are depicted. A simplified version of first processing system 230 is depicted including processing unit 302 and volatile programmable logic array 305. Second processing system 232 is depicted with processing units 322 and programmable logic array 305.

FIG. 8 depicts a plurality of partitioned operating environments POE0-POE 7 created across the heterogeneous processing system. FIG. 8 also depicts a specific allocation of vehicle and mission control processes to further illustrate the disclosed subject matter. Specifically, a first partitioned operating environment POE0, a second partitioned operating environment POE1, and a third partitioned operating environment POE2 are allocated at the one or more processing units 302. In some examples, the partitioned operating environments are hardware partitions. For example, POE0 may be allocated at APU 306, POE1 may be allocated at RPU 310, and POE2 may be allocated at GPU 308. In other examples, the partitioned operating environments are software partitions, such as different virtual machines virtualized from one or more processing units. For example, one or more of APU 306, GPU 308, and RPU 310 may be virtualized to create the three partitioned operating environments. A fourth partitioned operating environment POE3 is allocated to programmable logic array 305. Although a single operating environment is depicted in FIG. 8, multiple operating environments may also be created within a programmable logic array. In one example individual partitioned operating environments with her programmable logic array represent different hardware elements such as different logic blocks. In other examples, virtualization or other software techniques may be used to create individual partitioned operating environments. Moreover, some embodiments include a combined virtualization of both processing unit 302 and programmable logic array 305. Any number and combination of hardware processors and virtual machines may be used to create individual partitioned operating environments as depicted in FIG. 8.

In FIG. 8, one or more first vehicle control processes (VCP) 502 and one or more first mission control processes (MCP) 504 are allocated to the first partitioned operating environment POE0. One or more VCPs 506 and one or more MCPs 508 are allocated to the second partitioned operating environment POE1. One or more MCPs 510 are allocated to the third partitioned operating environment POE2. One or more MCPs 512 are allocated to the fourth partitioned operating environment POE3.

FIG. 8 illustrates that a plurality of vehicle control processes and mission control processes may be allocated across multiple partitioned operating environments to meet the needs of a particular implementation. For example, control processes may be categorized and the categories used to assign control processes to particular partitioned operating environments. In some implementations, the first processing system can provide at least two partitioned operating environments. Similarly, the second processing system can provide at least two partitioned operating environments. For example, the first processing system may include a high integrity partition and a cluster partition. The high integrity partition may include real-time operating environment. Such an operating environment may be configured for execution of one or more critical vehicle navigation processes for example. Other processes may be placed into the high integrity partition as well. The cluster partition may include non-real-time operating environment. Such an operating environment may be configured for execution of one or more mission control processes. Other processes may be placed into the cluster partition as well.

By way of specific example, POE0 may be used to execute critical control processes. For instance, POE0 can be a high integrity partitioned including autopilot, guidance, and navigation processes with auto-generated code from a model based design flow. In one example, a standalone operating system can be used for a first partitioned operating environment allocated for critical processes. POE1 may be used to execute less critical, but time sensitive vehicle and mission control processes. For example, mission navigation processes, datalink management processes, sensor data management processes, and/or ground station/other C2 processes may be allocated to the second partitioned operating environment. By way of further example, sensor processing and backend parameter analysis of health and/or other parameters, etc. may be allocated to the third partitioned operating environment POE2. Finally, a fourth partitioned operating environment POE3 may be allocated to high processing requirement applications such as image analysis and object detection and tracking. For example, sensor-relative navigation and robotic perception/cognition may be performed in the fourth partitioned operating environment.

In other examples geo-registration of sensor collection including targeting and alternate navigation sources may be allocated to POE 3. Additionally, software defined radio including signal intelligence collection and flexible data links for payload data dissemination may be allocated. In some examples, one or more of POE1, POE2, and POE3 may be a virtualized computing cluster form for mission control processes that are isolated from the high integrity partition. It will be appreciated that the examples are provided by way of explanation only and numerous other options allocations may be made according to the requirements of a particular implementation.

Referring to the second processing system 232, a fifth partitioned operating environment POE4 may be allocated for additional vehicle control processes. In some examples, POE4 may be used to execute critical and/or time sensitive vehicle control processes such as backup navigation and piloting processes. The sixth partitioned operating environment POE5 may be allocated for additional mission control processes. In some examples, POE5 may be used to execute less critical or time sensitive mission control processes. The seventh partitioned operating environment POE6 is allocated to programmable logic array 325. In this example, POE6 is allocated for execution of one or more vehicle control processes. By way of particular example, navigation monitoring and/or control processes may be configured in the seventh partitioned operating environment POE6 in one embodiment. As described in more detail hereinafter, one or more monitoring and/or control processes may be implemented in POE6 in one implementation.

The heterogeneous processing system provided by first circuit board 120 is uniquely situated to handle the diverse and high reliability requirements of UAV's. More particularly, the heterogeneous processing system enables joint processing by two disparate processing systems to provide monitoring, correction, and backup functions. For example, one or more components of first processing system 230 may monitor execution of one or more processes at the second processing system 232 and generate control actions based on the monitor execution. Similarly, one or more components of the second processing system 232 may monitor execution of one or more processes at the first processing system 234 and generate control actions based on the monitored execution. By way of example, the second processing system may detect one or more anomalies associated with execution of a process by the first processing system and restart the process and/or the first processing system. By way of additional example, the second processing system may execute a backup process in response to a detected anomaly associated with the first processing system. In yet another example, the second processing system may monitor an output of the first processing system and check for a concurrence with an output of the second processing system. In response to a concurrence, a control action such as enabling a vehicle device may be initiated.

Figure 9:
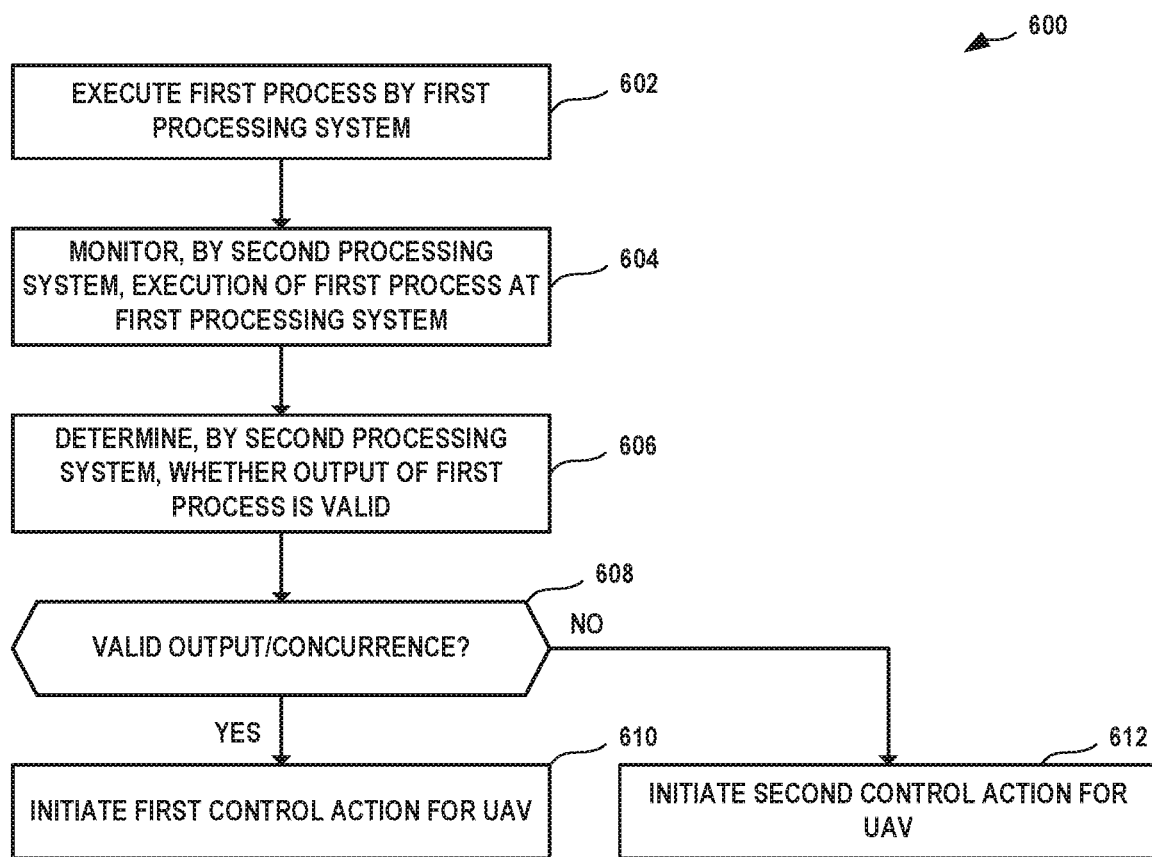
FIG. 9 is a flowchart describing a process of monitoring, by a second processing system, process execution at a first processing system.

FIG. 9 is a flowchart describing a process 600 of joint processing of a management processes by a heterogeneous processing system in accordance with embodiments of the disclosed technology. Although process 600 describes monitoring by the second processing system execution of a process by the first processing system, it will be appreciated that the process may be similarly used by the first processing system to monitor execution of the process by the second processing system. In one example, process 600 can be performed by a dedicated process within a programmable logic array of the processing system. In another example, process 600 may be performed by one or more processing units.

At (602), a first process is executed by the first processing system. For example, an application or other set of instructions can be executed by one or more processing units and/or the volatile programmable logic array of the first processing system.

At (604), the second processing system monitors execution of the first process at the first processing system. In some implementations, monitoring execution of a process includes monitoring an output of the first processing system. In other examples, monitoring execution of a process includes monitoring for one or more anomalies associated with execution of the process by the first processing system.

At (606), the second processing system determines whether the output of the first processes is valid. In some examples, determining whether the output is valid includes determining whether the first processing systems is generating the output. If the first processing system is generating an output, the second processing system determines that the output is valid. In another example, monitoring the output includes determining whether the output includes a valid signal. For example, the second processing system can determine whether the output includes a signal consistent with the first process being executed at the first processing system. In another example, the second processing system can determine whether the output matches or shares a concurrence with another output. For instance, the second processing system can determine whether the output of the first processing system matches or is the same as an output of the second processing system in one example.

At (608), process 600 branches based on whether the output of the first process was determined to be valid and/or shared a concurrence with another output. If the output of the first process is determined to be valid, a first control action is generated for the unmanned aerial vehicle at (610). If the output of the first process is determined to be invalid, a second control action is generated for the unmanned aerial vehicle at (612). As described in more detail hereinafter, the first control action may include providing the output of the first process. The second control action may include restarting the first process or the first processing system, executing a backup process, configuring a new process, or other suitable actions.

Figure 10:
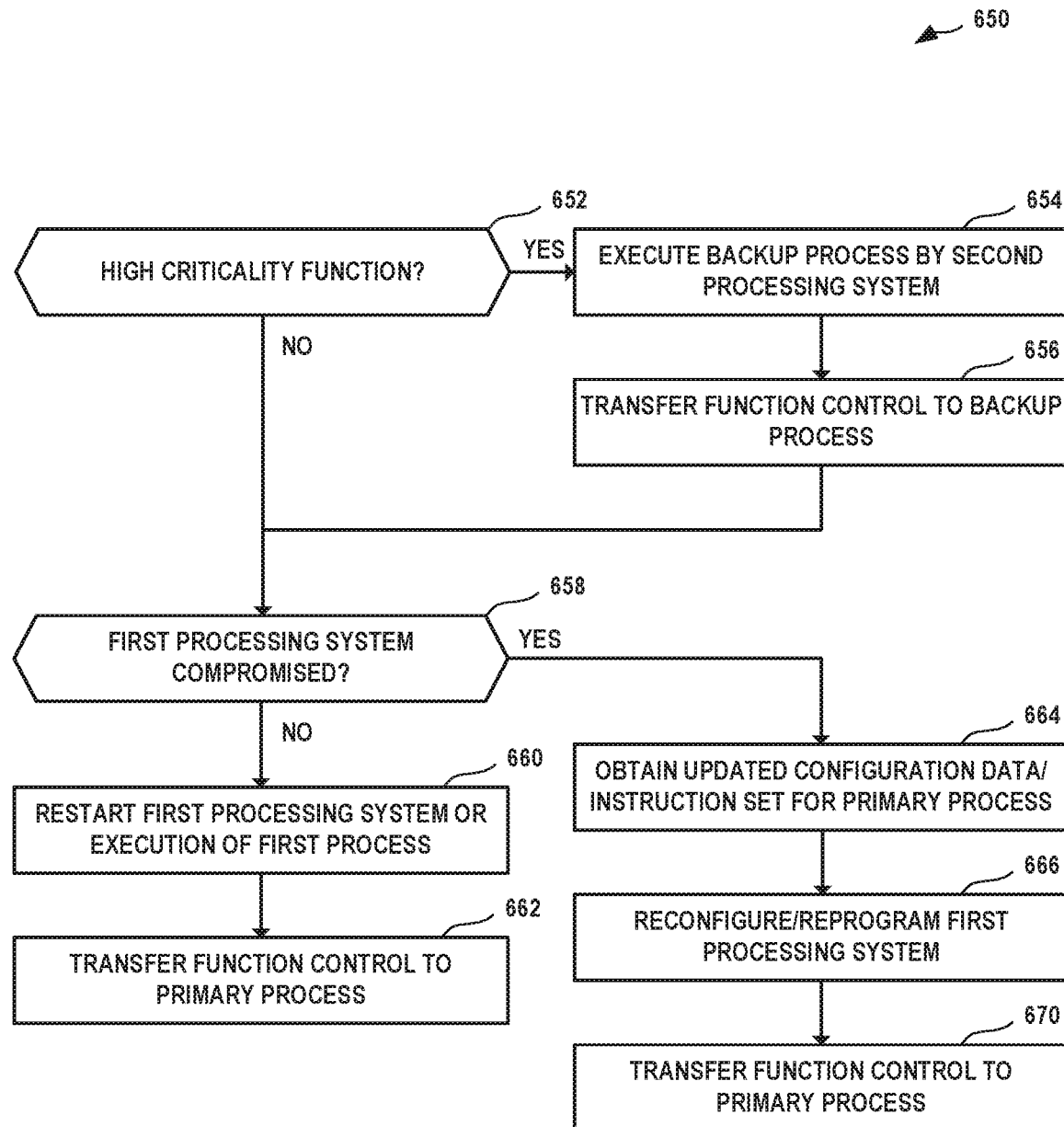
FIG. 10 is a flowchart describing a process of initiating control actions based on an output of a processing system.

FIG. 10 is a flowchart describing a process 650 of initiating control actions based on monitoring execution of a first processing system by a second processing system or vice versa. More particularly, process 650 describes second control actions that may be generated based on invalid output of the first processing system. For example, process 650 may be performed by second processing system 232 at (612) of process 600 shown in FIG. 9.

At (652), process 650 determines whether the first process associated with the invalid output signal is associated with a high criticality function of the UAV. For example, the second processing unit may take different actions based on type of process for which an invalid output was detected. In this manner, the second processing system may be adapted to the particular requirements of various implementations. In a particular example, all vehicle control processes may be considered to be associated with high criticality vehicle functions. Similarly, a subset of mission management processes such as navigation or certain sensor data management may be considered to be associated with high criticality functions.

If the control action is being initiated in response to a high criticality function, process 652 continues at (654). At (654), a backup process for the first process is executed by the second processing system. In some examples, the second processing system executes the backup process in one or more processing units 322. In other examples, the second processing system executes the backup process in programmable logic circuit 324.

At (656), function control is transferred to the backup process. For example, the second processing system can transfer control of the high criticality function from the first process to the backup process. It will be appreciated that the backup process may be executed by the second processing system prior to detecting an invalid output. For example the backup process may already be executing in the second processing system. In response to an invalid output from the first processing system, function control can be transferred to the backup process.

After transferring function control to the backup process, or in response to determining that the function is not a high criticality function, process 650 continues at 658. At (658), process 650 determines whether the first processing system has been compromised. For example, the second processing system can determine whether the invalid output is associated with an unauthorized modification of the first process at the first processing system. In some examples, the second processing system may detect an unauthorized modification in response to unexpected outputs of the first processing system. In other examples, the second processing system may detect an unauthorized modification by the presence of malicious code.

If the first processing system has been compromised, process 650 continues at (664). At (664), the second processing system obtains updated configuration data and/or an updated instruction set for the primary process. The updated configuration data may be obtained locally from memory 332 for example, or remotely from information transmitted by a ground station for example.

At (666), the first processing system is reconfigured and/or preprogrammed based on the updated configuration data and/or instruction set. For example, the second processing system may transmit an updated configuration data file and/or instruction set to the first processing system. One or more processing units of the first processing system can be reprogrammed and/or the programmable logic array can be reconfigured. In some examples, the primary process can be reconfigured to avoid a subsequent unauthorized modification of the first processing system. For example, the primary process can be modified to avoid a subsequent exploit of a vulnerability that may have been used to have initially compromised the first processing system.

At (670), function control is transferred back to the first processing system. In some examples, (670) includes transferring function control from the backup process to the reconfigured primary process.

If the first processing system is not compromised, process 650 continues at (660). At (660), process 650 restarts the first processing system or restarts execution of the first process by the first processing system. For example, the second processing system may restart execution of the first process or restart the first processing system in its entirety in an effort to alleviate the cause of the invalid output. For example, the invalid output may be detected as a loss of the output signal due to a power or other failure of the first processing system. Restarting the first processing system or the first process may again cause the output to be validly generated. At (662), function control is transferred to the primary process if function control was earlier transferred to the backup process at (656).

Figure 11:
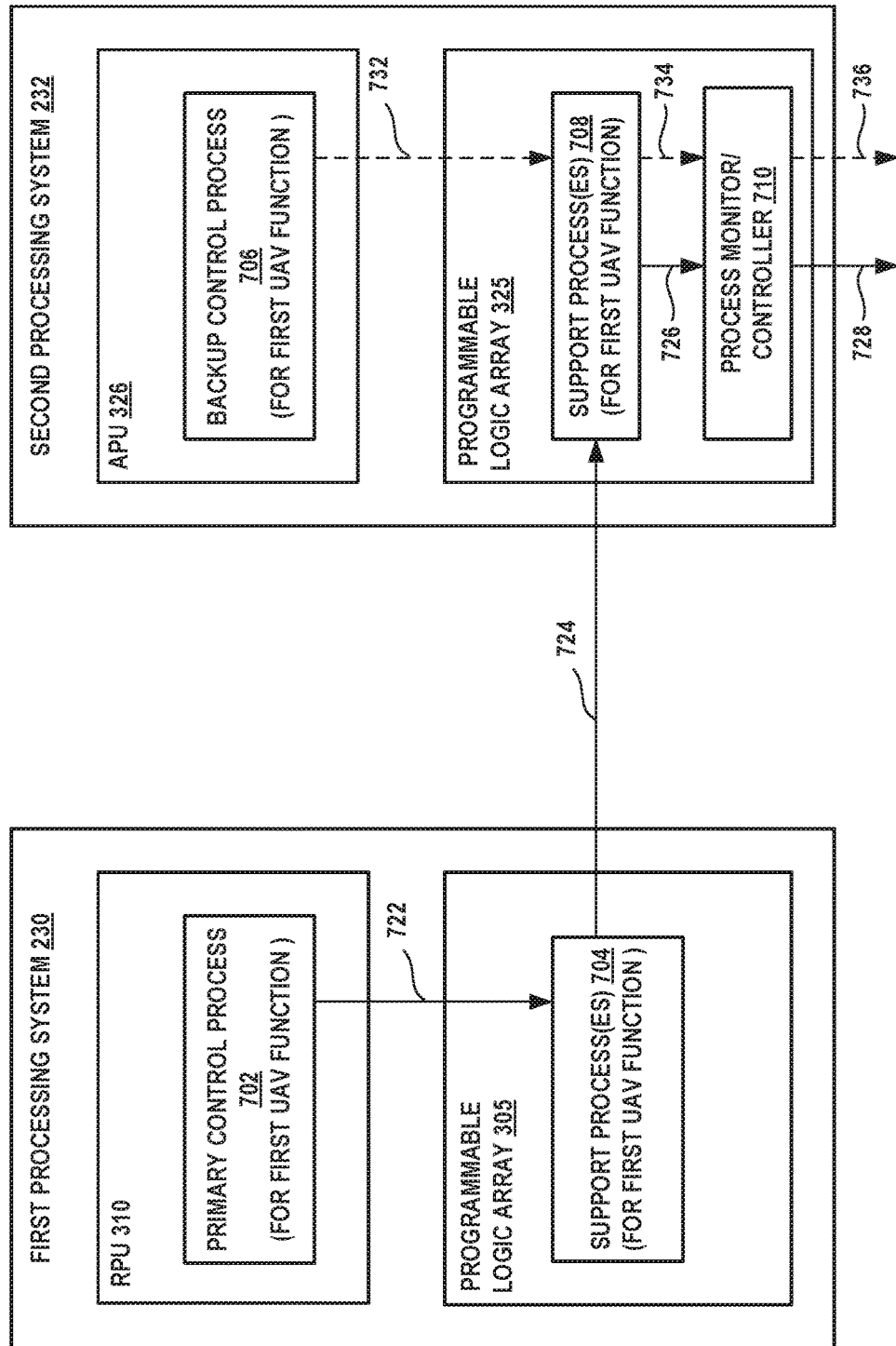
FIG. 11 is a block diagram depicting an example of monitoring execution of processes by a first processing system and transferring control of a vehicle function to a second processing system.

FIG. 11 is a block diagram depicting first circuit board 120 and a monitoring process that can be performed by second processing system 232 in accordance with example embodiments of the disclosed technology. In another example, a similar process may be performed by first processing system 230.

First processing system 230 is depicted with real-time processing unit (RPU) 310 executing a primary control process for a first UAV function. By way of example, the primary control process may include a first instruction set stored in memory and executed by RPU 310. Primary control process 702 generates an output 722 that is provided to one or more support processes 704. Support processes 704 are associated with the first UAV function. By way of example, the primary control process may be an autopilot process configured to generate output commands for navigating of piloting the UAV based on sensor data. The one or more support processes 704 may include a pulse width modulation (PWM) servo command generation unit. The PWM servo command generation unit may receive the commands from a first output 722 of the autopilot process and generate as an output 724, the appropriate PWM servo commands. In another example, the primary control process 702 may be a payload delivery control process. Although PWM servo commands are described, any type of servo command signal and servo command generation unit may be used, such as serial data bus, analog phase/amplitude, etc.

Second processing system 232 includes one or more support processes 708 that are also associated with the first UAV function. By way of example, support processes 708 may include a de-serializer process in some examples. The de-serializer process may receive serial PWM servo commands and generate PWM commands that can be stored in the buffer. Support processes 708 provide an output 726 to process monitor/controller 710. Process monitor/controller 710 is configured to determine whether primary control process 702 is generating a valid output. In one example, process monitor/controller 710 is configured to determine whether an output 726 is received from support processes 708 in order to determine whether the primary control process 702 is generating a first output 722. In another example, process monitor/controller 710 is configured to determine whether an output 724 is received by support processes 708 in order to determine whether the primary control process 702 is generating a first output 722 that is valid. In another example, process monitor/controller 710 is configured to determine whether the content of output 726 is valid in order to determine whether first output 722 is valid. If process monitor/controller 710 determines that the output 722 is valid, an output 728 is provided. In one example, output 728 includes PWM servo commands received from support processes 708.

Support processes 708 are further configured to receive a second output 732 from a backup control process 706 executed by APU 326 of the second processing system 232. For example, backup control process 706 may be a backup autopilot process or a backup payload delivery process. Support processes 708 may receive commands from the backup autopilot process and generate PWM servo commands in one example. Support processes 708 generate an output 734 which is provided to process monitor/controller 710. If process monitor/controller 710 determines that the output 722 of the primary control process 702 is invalid, it can generate an output 736 including the output 732 of the backup control process.

In some implementations, processor monitor/controller 710 may determine whether the first output 722 of the first processing system 230 is valid based on comparing the first output to the second output 732 from the second processing system. For example, process monitor/controller 710 can determine whether the first output 722 and the second output 732 match or are otherwise have a concurrence. If there is a concurrence between the first output 722 and the second output 732, the processor monitor/controller 710 may determine that the first output 722 is valid.

FIG. 11 is a specific example where process monitor/controller 710 enables a backup control process 706 in response to an invalid output associated with the primary control process 702. In other examples, process monitor/controller 710 can be configured to enable a vehicle device or initiate a particular function based on the output of a process executed by each processing system. For example, a payload delivery system may be enabled or activated based on a concurrence between an output generated by the first processing system and an output generated by the second processing system.

Referring now to FIGS. 12 through 16, further embodiments of improved control boxes 100 and components thereof are generally provided. As discussed, control box 100 in accordance with the present disclosure generally houses the various electrical/computing components which control operation of an unmanned aerial vehicle ("UAV"), and the control box 100 is thus generally mounted on the UAV. Control boxes 100 in accordance with the present disclosure are particularly advantageous due to their modular design, wherein various components of the control boxes 100 such as the heat sink, cover, and/or stiffener, as discussed herein, are each interchangeable with various different designs for each such component. Certain features as discussed herein help to facilitate such modularity. Additionally, as discussed herein, various features of such control boxes 100 such as the heat sink, the stiffener, and the system on module ("SOM") circuit board include advantageous heat transfer features for transferring heat from the SOM circuit board and from the control box 100 generally. Other advantageous features will be discussed herein.

A control box 100 in accordance with the present disclosure may define a lateral direction 102, a longitudinal direction 104, and a transverse direction 106, as shown. Such directions 102, 104, 106 may together define an orthogonal coordinate system for the control box 100.

Control box 100 may include a housing 110 which defines an interior 112. The housing 110 in exemplary embodiments includes a cover 114 and one or more stiffeners 116. In some embodiments, only a single stiffener 116 is utilized in a control box 100, although in alternative embodiments more than one stiffener 116 may be utilized. In embodiments wherein the housing 110 includes a cover 114 and stiffener(s) 116, at least one such stiffener 116 is removably connected in contact with the cover 114, and the stiffeners 116 are stacked on each other and the housing 110 along the transverse direction 106. Control box 100 may further include a heat sink 118. The heat sink 118 may be removably connected to the housing 110, such as in contact with one of the plurality of stiffeners 116. The heat sink 118 may further be stacked on the stiffeners 116 and the housing 110 along the transverse direction 106.

One or more circuit boards may be disposed within the interior 112. For example, a first circuit board 120 may be disposed in the interior 112. In exemplary embodiments, the first circuit board 120 is a system on module ("SOM") circuit board such as the example SOM circuit board 200 as discussed herein. Such first circuit board 120 may in exemplary embodiments be positioned between the housing 110 and the heat sink 118, such as between a stiffener 114 and the heat sink 118. Further, the first circuit board 120 may be in contact with the heat sink 118 such that heat from the first circuit board 120 is dissipated from the first circuit board 120 through the heat sink 118. Additionally, the first circuit board 120 may be in contact with a stiffener 114.

For example, the first circuit board 120 may include one or more computing components. Such computing components may include a first processing system 230, a second processing system 232, and/or one or more memory blocks 234, all of which are discussed in detail herein, such as in the context of SOM circuit board 200. Further, a thermal interface material 236 (discussed in detail below in the context of SOM circuit board 200) may be disposed on one or more of such computing components. In exemplary embodiments, the first circuit board 120, such as the thermal interface material 236 disposed on one or more of the computing components, may contact the heat sink 118 and/or a stiffener 116.

In some embodiments, the thermal interface material 236 may be in contact with the heat sink 118. In particular, the thermal interface material 236 that is disposed on one or more computing components (such as first processing system 230, a second processing system 232, and/or one or more memory blocks 234 that are mounted on a first face surface 210 of the circuit board 120 as discussed below in the context of the SOM circuit board 200) may be in contact with the heat sink 118, such as a base 130 thereof.

Additionally or alternatively, the stiffener 116 may include a plurality of fingers 140. Fingers 140 are generally planer inner surfaces of the stiffener 116 which contact other components for support and heat transfer purposes. The first circuit board 120 may contact such fingers 140. In particular, the thermal interface material 236 that is disposed on one or more computing components (such as one or more memory blocks 234 that are mounted on a second face surface 212 of the circuit board 120 as discussed below in the context of the SOM circuit board 200) may be in contact with the fingers 140.

In exemplary embodiments, the stiffener 116 includes an outer frame 142 and one or more cross-members 144. Stiffener 116 may additionally include fingers 140. When first circuit board 120 contacts stiffener 116, the first circuit board 120 may contact the outer frame 142 and/or one or more of the cross-members 144, and may further contact fingers 140 as discussed above.

Figure 12:
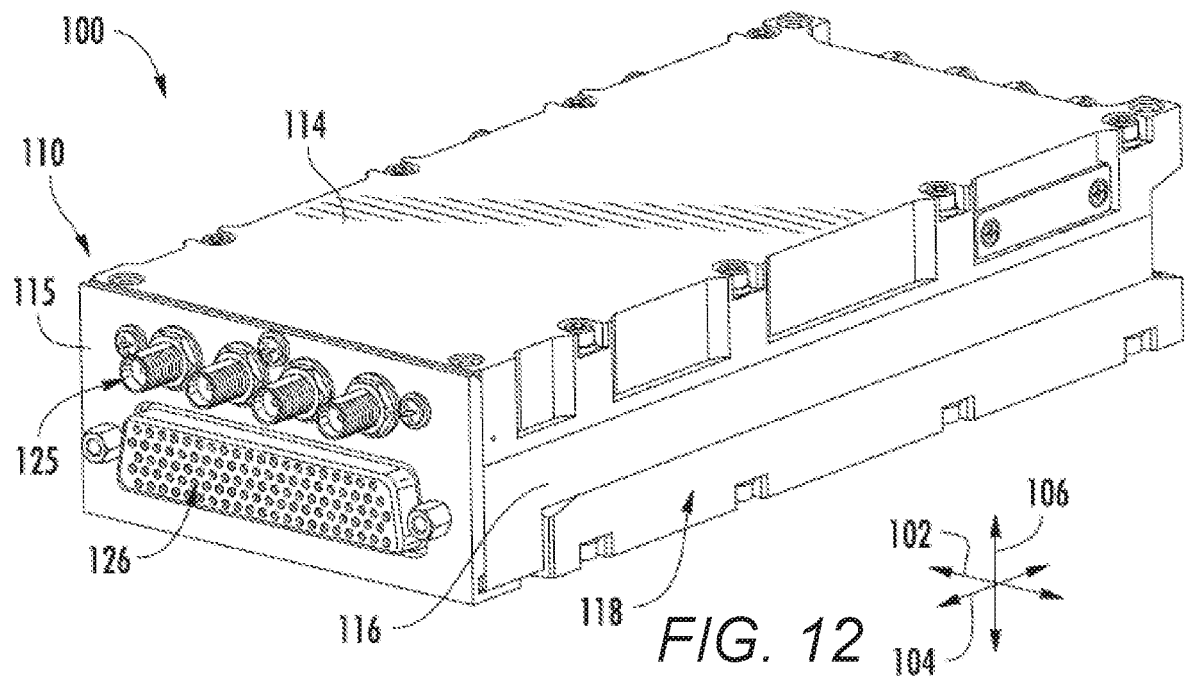
FIG. 12 is a perspective view of a control box in accordance with embodiments of the present disclosure.
Figure 13:
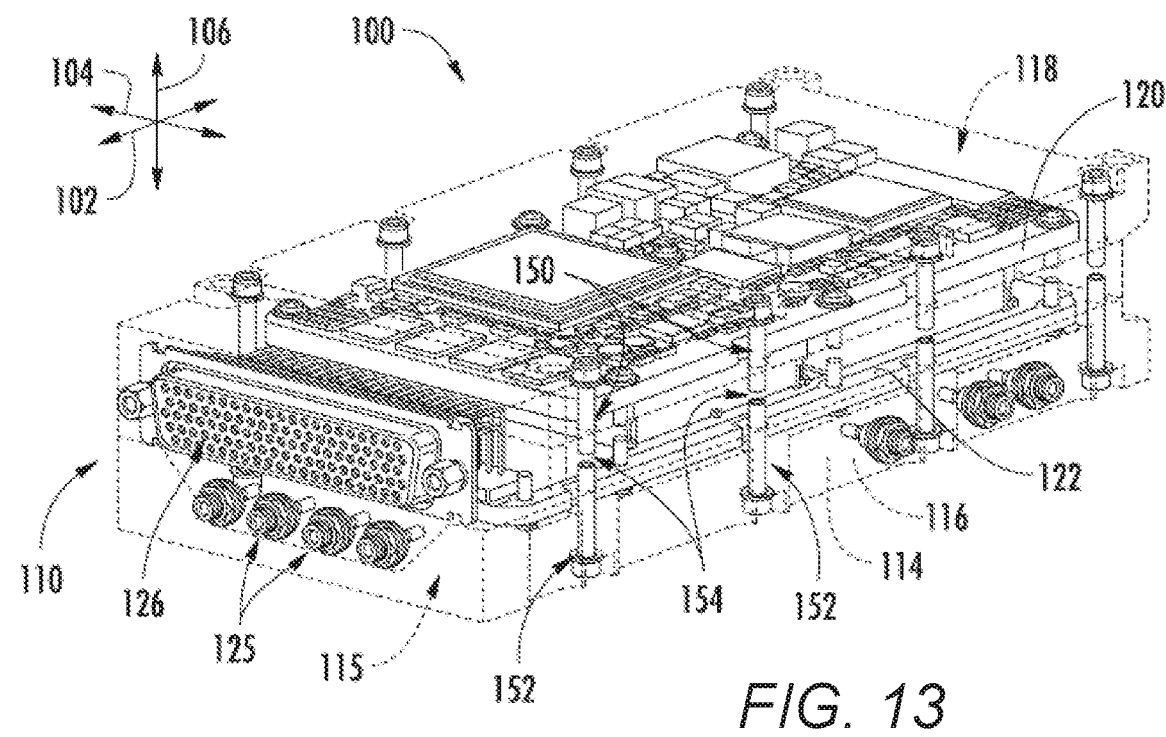
FIG. 13 is a perspective view showing internal components of a control box in accordance with embodiments of the present disclosure.
Figure 14:
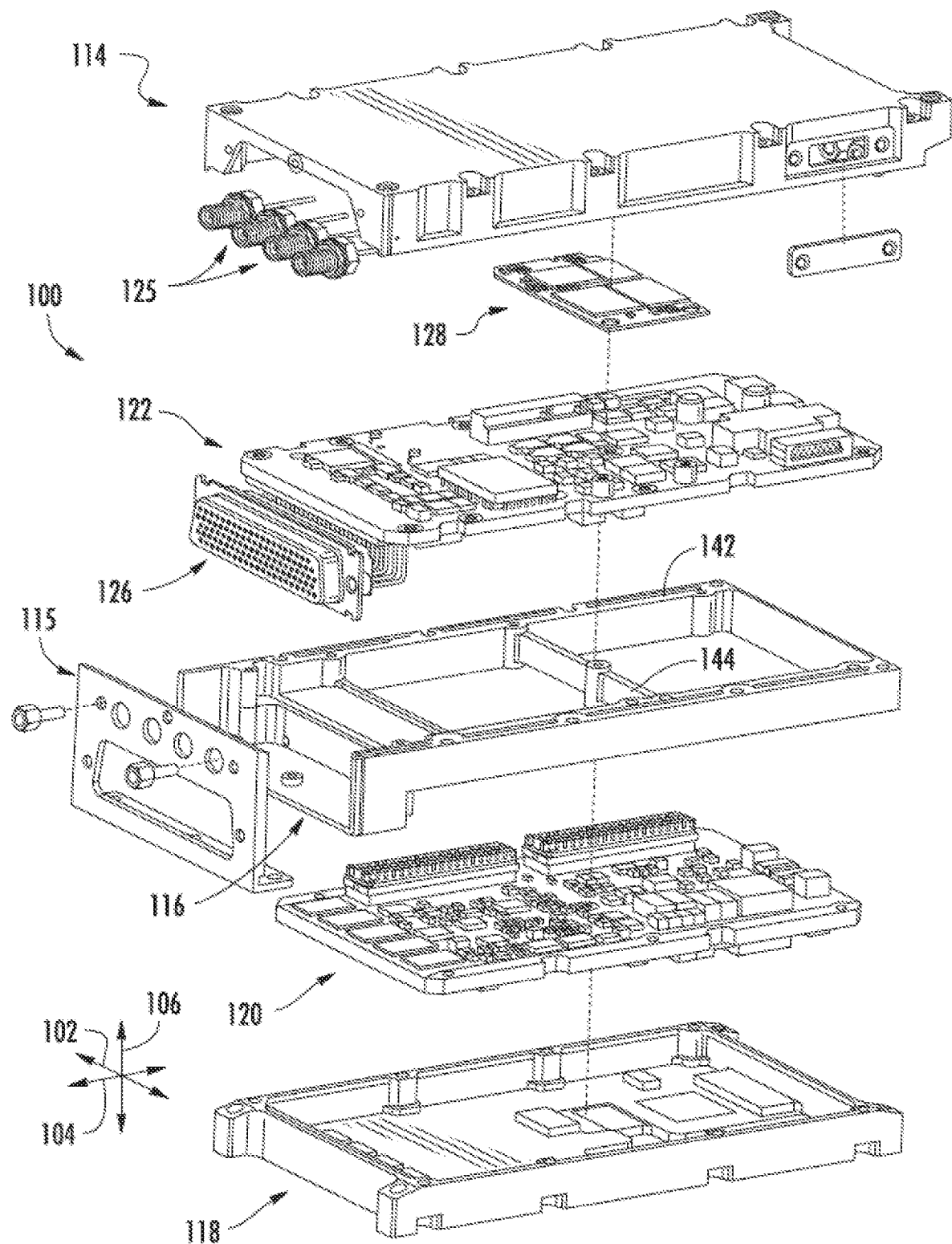
FIG. 14 is an exploded perspective view of a control box in accordance with embodiments of the present disclosure.

In exemplary embodiments, heat sink 118 is formed from a metal. Heat sink 118 may include a base 130. Base may in exemplary embodiments be in contact with the first circuit board 120, such as components thereof as discussed above. Further, in some exemplary embodiments (not shown), heat sink 118 may include a plurality of fins 132 which extend externally from the base 130. In these embodiments, heat sink 118 may provide convective heat transfer from the control box 100 via fins 132. In other embodiments, as illustrated in FIGS. 12-14, no fins 132 may be provided and heat sink 118 may provide conductive heat transfer from the control box 100 via contact of the base 130 with other components in, for example, the subject UAV to which the control box 100 is mounted. In still other embodiments, heat sink 118 may further include single use or reversible phase change materials, liquid cooling materials, and/or other suitable components for facilitating heat transfer.

Control box 100 may further include a second circuit board 122. Second circuit board 122 may, for example, be a carrier card-type circuit board which generally includes communications related components, such as sonar, radar, GPS, radio, etc. related components, including various integrated circuits forming interface circuits. The second circuit board may be disposed within the interior 112. For example, such second circuit board 122 may in exemplary embodiments be positioned between the cover 114 and the stiffener 116. Further, the second circuit board 122 may be in contact with the stiffener 116.

In exemplary embodiments, second circuit board 122 is in operative communication with first circuit board 120. For example, second circuit board 122 may further include one or more input/output connectors 124 which are positioned on the second circuit board 122 to operatively contact mating input/output connectors (such as connectors 238 in SOM circuit board 200 embodiments) of the first circuit board 120.

In some embodiments, second circuit board 122 may further include one or more sensor connectors 125. Such sensor connectors 125 may extend from the housing 110, such as along the longitudinal direction 104 as shown in FIGS. 12 through 14 or in another suitable direction. These sensor connectors 125 may be ports for connection of the second circuit board 122 to suitable external sensors or other secondary devices 12 (such as those discussed herein) which may, for example, be mounted on the UAV on which the control box 100 is mounted.

Control box 100 may additionally include one or more input/output connectors 126 which extend from the housing 110. In exemplary embodiments, one or more of such connector(s) 126 are components of the second circuit board 122. Such input/output connectors 126 may connect the control box 100 and components thereof to other components of, for example, the UAV on which the control box 100 is mounted. In some embodiments, as illustrated in FIGS. 12-14, the input/output connector(s) 126 extend from the housing 110 along the longitudinal direction 104, such as through an end faceplate 115 of the housing 110. In other embodiments, the input/output connector(s) 126 extend from the housing 110 along the transverse direction 106, such as through the cover 114.

In some embodiments, control box 100 may further include a mezzanine card 128. Mezzanine card 128 may be disposed within interior 112, and may be in operative communication with the second circuit board 122. Mezzanine card 128 may, for example, be disposed between second circuit board 122 and cover 114. In some embodiments, one or more of the input/output connectors 126 are components of the mezzanine card 128.

As shown, the heat sink 118 and components of the housing 110 may include through-holes. The various through-holes may advantageously align to facilitate the modularity of the various components of control box 100. For example, a plurality of through holes 150 may extend through the base 130 of heat sink 118, such as along the transverse direction 106. Such through holes 150 may be arranged in a pattern. Further, a plurality of through holes may extend through the housing 110, such as along the transverse direction 106. Such through holes may be arranged in a pattern. Such through holes may, for example, include through holes 152 which extend through the cover 114 along the transverse direction 106 and in a pattern, and through holes 154 which extend through the stiffener 116 along the transverse direction 108 and in a pattern. In exemplary embodiments, the patterns of through holes in the base 130 and housing 110, such as the through holes 150, 152, and 154, are identical. Accordingly, fasteners may be inserted through the through holes 150, 152, 154 to fasten such components of the control box 100 together. Notably, such identical pattern may extend to a variety of different types of heat sinks 118 and housings 110 (and covers 114 and stiffeners 116 thereof), such that different versions of such components can be swapped with each other in a module fashion.

When the heat sink 118 contacts the housing 110, such as the stiffener 116 thereof, such components may fit together using a "tongue-and-groove" type feature. Such feature advantageously orients the components relative to one another to ensure a proper fit, and also advantageously acts as an electro-magnetic interference ("EMI") filter.

Figure 15:
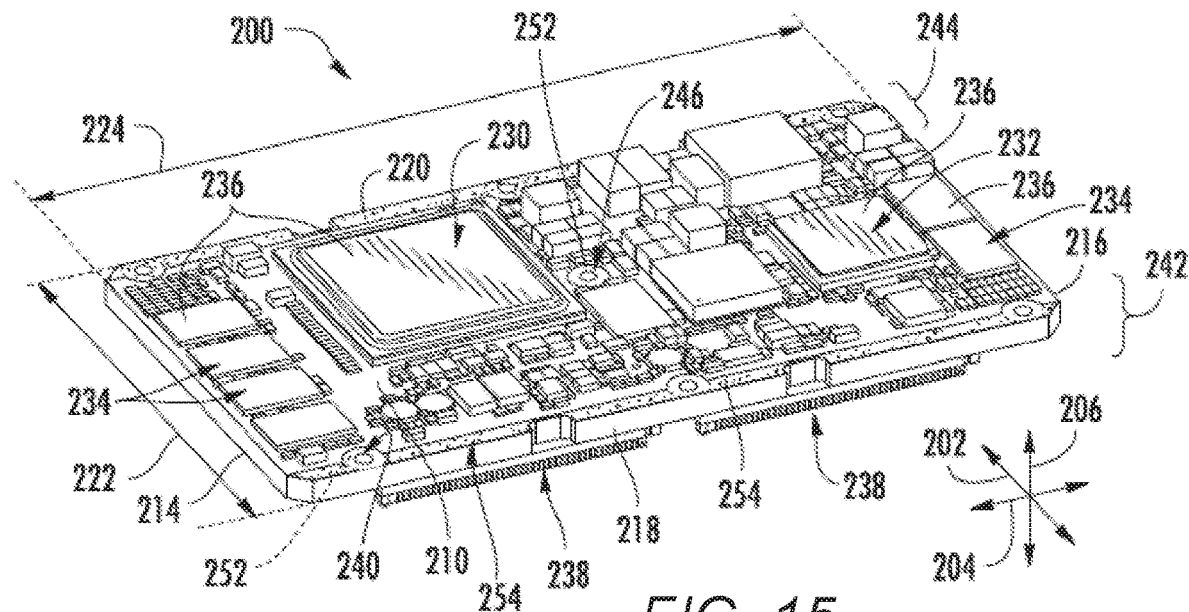
FIG. 15 is a perspective top view of a system-on-module circuit board in accordance with embodiments of the present disclosure.
Figure 16:
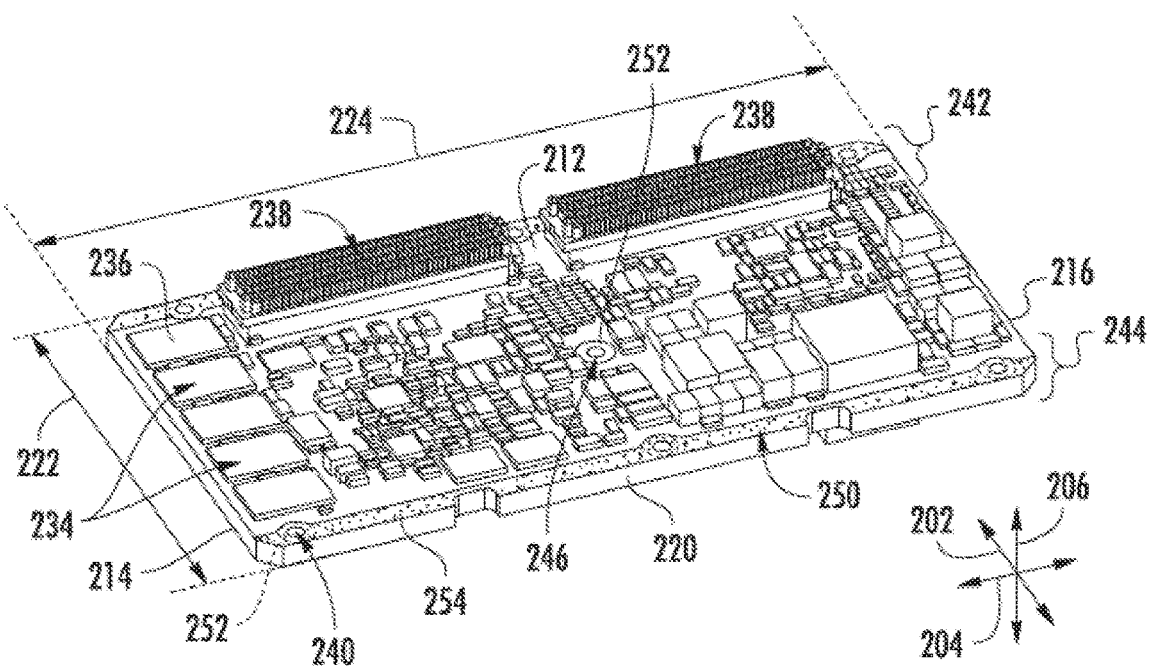
FIG. 16 is a perspective bottom view of a system-on-module circuit board in accordance with embodiments of the present disclosure.

Referring now to FIGS. 15 and 16, a control box 100 in accordance with the present disclosure may include a system on module ("SOM") circuit board 200, which may be the first circuit board 120 as discussed above. The SOM circuit board 200 may define a lateral direction 202, a longitudinal direction 204, and a transverse direction 206, as shown. Such directions 202, 204, 206 may together define an orthogonal coordinate system for the SOM circuit board 200. When the SOM circuit board 200 is installed in a control box 100, the directions 202, 204, 206 may correspond to the respective directions 102, 104, 106.

SOM circuit board 200 may have a main body 208 which includes a plurality of outer surfaces. For example, main body 208 includes a first face surface 210 and a second opposing face surface 212, both of which generally extend within planes defined by the lateral direction 202 and longitudinal direction 204. Main body 208 further includes a first end surface 214 and an opposing second end surface 216, both of which generally extend within planes defined by the lateral direction 202 and the transverse direction 206. Main body 208 further includes a first side surface 218 and an opposing second side surface 220, both of which generally extend within planes defined by the longitudinal direction 204 and the transverse direction 206.

In generally, the SOM circuit board 200 and main body 208 thereof has a hyperrectangular shape, as shown. Accordingly, first and second end surface 214, 216 also each have a length 222, which is a maximum length along the lateral direction 202. First and second side surfaces 218, 220 each also have a length 224, which is a maximum length along the longitudinal direction 204. As shown, in exemplary embodiments, the maximum lengths 224 are greater than the maximum lengths 222.

The SOM circuit board 200 may further include a plurality of computing components. Each computing component may be mounted on the main body 208, such as on the first face surface 210 or second face surface 212. For example, the computing components may include a first processing system 230, a second processing system 232, and a plurality of memory blocks 234. Notably, the first and second processing systems 230, 232 and the memory blocks 234 may in exemplary embodiments be integrated together in a cohesive computing system with the two processing systems 230, 232 operating together. Accordingly, for example, the first processing system 230 can monitor and back up the second processing system 232 and the second processing system 232 can monitor and back up the first processing system 230.

In some embodiments, for example, the first processing system 230 may be a random access memory ("RAM") based processing system. Additionally or alternatively, the second processing system 232 may in some embodiments be a flash memory-based processing system. Additionally or alternatively, the memory blocks 234 may be RAM memory blocks.

As shown, in exemplary embodiments, the first and second processing systems 230, 232 may be mounted on the first face surface 210 of the main body 208. Alternatively, however, one or both of the first and second processing systems 230, 232 may be mounted on the second face surface 212 of the main body 208. Further, in some embodiments, at least one or more of the memory blocks 234 may be mounted on the first face surface 210. Additionally or alternatively, at least one or more of the memory blocks 234 may be mounted on the second face surface 212.

In some embodiments, a thermal interface material 236 may be disposed on one or more of the computing components. The thermal interface material 236 may facilitate heat transfer from such computing components to other components of the control box 100, as discussed herein. Suitable thermal interface materials 236 may, for example, be relatively compliant materials which may for example be curable. In exemplary embodiments, such materials 236 may be thixotropic materials. In exemplary embodiments, such materials 236 may have a thermal conductivity of between 3.2 and 4 W/m-K, such as between 3.4 and 3.8 W/m-K, such as 3.6 W/m-K. One suitable materials is Gap Filler 3500S35, which is commercially available from The Bergquist Company.

In exemplary embodiments, the thermal interface material 236 may be disposed on the memory blocks 234, such as one or more of the memory blocks 234 mounted on the first face surface 210 and/or one or more of the memory blocks 236 mounted on the second face surface 212. Additionally or alternatively, the thermal interface material 236 may be disposed on the first processing system 230 and/or the second processing system 232.

One or more input/output connectors 238 may additionally be mounted on the main body 208. These connectors 238 may connect the SOM circuit board 200 to other circuit boards, as discussed herein, in the control box 100, thus allowing communication between the SOM circuit board 200 and such other circuit boards. The connectors 238 may, for example, be mounted on the second face surface 212 as shown, or alternatively may be mounted on the first face surface 210. In some embodiments, the connectors 238 may be disposed proximate the first side surface 218, and thus closer to the first side surface 218 than the second side surface 220 along the lateral direction 202. In some of these embodiments, no connectors 238 may be provided proximate the second side surface 220. Further, longitudinal axes of the connectors 238 may be aligned along the longitudinal direction 204, as shown.

As further illustrated, a plurality of mounting holes 240 may extend through the main body 208. One or more of these mounting holes 240 may, for example, be utilized to connect the SOM circuit board 200 to other components in the control box 100. Each mounting hole 240 may extend along the transverse direction 206 through and between the first face surface 210 and the second face surface 212.

The locations of the mounting holes 240 in the main body may be particularly advantageous. For example, a first array 242 of the mounting holes 240 may be disposed proximate the first side surface 218, and in exemplary embodiments between the connectors 238 and the first side surface 218 along the lateral direction 202. The mounting holes 240 of the first array 242 may be spaced apart from each other along the longitudinal direction 204. In exemplary embodiments, the first array 242 may include three or more mounting holes, although in alternative embodiments two mounting holes may be utilized. A second array 244 of the mounting holes 240 may be disposed proximate the second side surface 220, and in exemplary embodiments may be spaced along the lateral direction 202 an equal distance from the second side surface 220 as the first array 244 is from the first side surface 218. The mounting holes 240 of the second array 244 may be spaced apart from each other along the longitudinal direction 204. In exemplary embodiments, the second array 244 may include three or more mounting holes, although in alternative embodiments two mounting holes may be utilized. The first and second arrays may advantageously both connect the SOM circuit board 200 to other components in the control box 100 and minimize any relative motion of the SOM circuit board 200 with respect to such components.

Additionally, one or more third mounting holes 246 may be disposed between the first array 242 and the second array 244 along the lateral direction 202. In exemplary embodiments, the one or more third mounting holes 246 may be positioned generally centrally between the first side surface 218 and the second side surface 220, such as along the lateral direction 202. The third mounting holes 246 may this be equally spaced from the first array 242 and the second array 244 along the lateral direction 202. Further, in embodiments wherein only a single third mounting hole 246 is utilized, the third mounting hole 246 may be positioned generally centrally between the first end surface 214 and the second end surface 216, such as along the longitudinal direction 204. The third mounting hole(s) 246 may be particularly advantageous, as such hole(s) 246 reduce resonant frequency issues during use of the SOM circuit board 200 and provide improved stiffness to the SOM circuit board 200.

In some embodiments, a plurality of vias 250 may be provided in SOM circuit board 200. Each via may extend through the body 208 along the transverse direction 206, and may protrude from the first face surface 210 and/or second face surface 212. Vias 250 may be located proximate the first side surface 218 and/or the second side surface 220. Vias 250 may in exemplary embodiments be formed from a metallic material, such as gold or copper, and may serve as heat transfer conduits to transfer heat from within the main body 208 and transfer this heat from the main body 208 and SOM circuit board 200 generally.

In some embodiments, one or more metallic coatings may be plated on the main body 208, such as on the first face surface 210 and/or second face surface 212 thereof. The metallic coatings may serve as heat transfer conduits to transfer heat from the main body 208 and SOM circuit board 200 generally.

For example, a first metallic coating 252 may be plated on portions of the body 208 (such as on the first face surface 210 and/or second face surface 212 thereof) defining the plurality of mounting holes 240 (including those mounting holes in the first and second arrays 242, 244 as well as the third mounting hole(s) 246. Such coating 252 may be discretely plated on such portions of the body 208, such that the various platings are not connected. In exemplary embodiments, such first metallic coating 252 is a copper coating, although in alternative embodiments gold or other suitable metals may be utilized.

Additionally or alternatively, a second metallic coating 254 may be plated the body 208 (such as on the first face surface 210 and/or second face surface 212 thereof). Such coating 252 may be located proximate the first and second side surfaces 218, 220, and may extend to such surfaces 218, 220, such as entirely along the length 224. In embodiments wherein both first and second metallic coatings 252, 254 are utilized, the second metallic coating 254 may be plated over the first metallic coating 252. In exemplary embodiments, such second metallic coating 254 is a gold coating, although in alternative embodiments copper or other suitable metals may be utilized.

Some embodiments of the disclosed technology may be implemented as hardware, software, or as a combination of hardware and software. The software may be stored as processor readable code and implemented in a processor, as processor readable code for programming a processor for example. In some implementations, one or more of the components can be implemented individually or in combination with one or more other components as a packaged functional hardware unit (e.g., one or more electrical circuits) designed for use with other units, a portion of program code (e.g., software or firmware) executable by a processor that usually performs a particular function of related functions, or a self-contained hardware or software component that interfaces with a larger system, for example. Each hardware unit, for example, may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, these components may include software stored in a processor readable device (e.g., memory) to program a processor to perform the functions described herein, including various mission and vehicle control processes.

Processing units can include any number and type of processor, such as a microprocessor, microcontroller, or other suitable processing device. Memory device(s) can include one or more computer-readable media, including, but not limited to, non-transitory computer-readable media, RAM, ROM, hard drives, flash drives, or other memory devices.

Memory blocks 234 and other memory described herein may can store information accessible by one or more processing units or logic array, including computer-readable instructions that can be executed by the one or more processor(s). The instructions can be any set of instructions that when executed by a processor, cause the processor to perform operations. The instructions can be software written in any suitable programming language or can be implemented in hardware. In some embodiments, the instructions can be executed by a processor to cause the processor to perform operations, such as the operations for controlling vehicle and/or mission functions, and/or any other operations or functions of a computing device.

The technology discussed herein makes reference to computer-based systems and actions taken by and information sent to and from computer-based systems. One of ordinary skill in the art will recognize that the inherent flexibility of computer-based systems allows for a great variety of possible configurations, combinations, and divisions of tasks and functionality between and among components. For instance, processes discussed herein can be implemented using a single computing device or multiple computing devices working in combination. Databases, memory, instructions, and applications can be implemented on a single system or distributed across multiple systems. Distributed components can operate sequentially or in parallel.

Although specific features of various embodiments may be shown in some drawings and not in others, this is for convenience only. In accordance with the principles of the present disclosure, any feature of a drawing may be referenced and/or claimed in combination with any feature of any other drawing.

This written description uses examples to disclose the claimed subject matter, including the best mode, and also to enable any person skilled in the art to practice the claimed subject matter, including making and using any devices or systems and performing any incorporated methods. The patentable scope of the disclosed technology is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A control system for an unmanned vehicle (UV), comprising:
a housing defining an interior;
a first circuit board disposed within the interior and including one or more processing circuits, the one or more processing circuits including a first processing system and a second processing system having heterogeneous field programmable architectures; and
a second circuit board disposed within the interior and in operative communication with the first control board, the second circuit board including a plurality of interface circuits associated with a plurality of vehicle devices of the UV and an input/output (I/O) interface between the plurality of interface circuits and the first and second processing systems;
wherein the first processing system includes a first microprocessor and a volatile programmable logic array and the second processing system includes a second microprocessor and a nonvolatile programmable logic array, wherein the nonvolatile programmable logic array is configured to monitor execution of a first process by the first microprocessor.

2. The control system of claim 1, wherein:
the first circuit board includes a first input/output (I/O) connector;
the second circuit board includes a second I/O connector connected to the first I/O connector of the first circuit board; and
the control system further comprises a third input/output (I/O) connector in operative communication with the second circuit board and extending from the housing.

3. The control system of claim 2, wherein:
the second circuit board comprises the third I/O connector;
the I/O interface includes the first I/O connector, the second I/O connector, and the third I/O connector.

4. The control system of claim 1, wherein:
the second circuit board includes a plurality of sensor connectors adapted for coupling to the plurality of vehicle devices of the UAV; and
the plurality of interface circuits are configured to receive a plurality of outputs of the plurality of vehicle devices of the UAV via the plurality of sensor connectors and to provide vehicle device data based on the plurality of outputs to the first circuit board via the second I/O connector.

5. The control system of claim 1, wherein:
the second circuit board includes a vehicle navigation integrated circuit.

6. The control system of claim 1, wherein:
the first circuit board is configured to execute a plurality of vehicle control processes and a plurality of mission control processes; and
the second circuit board is configured to provide the I/O interface between the UAV and the plurality of vehicle control processes and the plurality of mission control processes.

7. The control system of claim 6, wherein:
the first processing system includes a first processing unit and a RAM-based field programmable gate array;
the second processing system includes a second processing unit and a flash-based field programmable gate array;
the first processing unit executes a first vehicle control process;
the second processing unit executes a second vehicle control process; and
the flash-based field programmable gate array manages control of a first vehicle device of the UAV based on the first vehicle control process and the second vehicle control process.

8. The control system of claim 7, wherein:
the one or more interface circuits are configured to provide the I/O interface between the first vehicle device and the first and second processing systems.

9. The control system of claim 1, wherein:
the plurality of vehicle devices includes at least one secondary device and at least one propulsion and movement device.

10. A control system for an unmanned vehicle (UV), comprising:
a housing defining an interior;
a first circuit board disposed within the interior, the first circuit board including a first input/output connector, a first integrated circuit comprising a first processing system, and a second integrated circuit comprising a second processing system, the first processing system including a first processing unit and a RAM-based programmable logic array, the second processing system including a second processing unit and a flash-based programmable logic array, wherein the flash-based programmable logic array is configured to monitor execution of a first process by the first processing system;
a second circuit board disposed within the interior, the second circuit board including a second input/output connector connected to the first input/output connector and a third input/output connector extending from the housing, the second circuit board including a plurality of interface circuits in operative communication with a plurality of sensor connectors of the second circuit board.

11. The control system of claim 10, wherein:
the first processing system includes a third processing unit and a fourth processing unit;
the first processing unit is an application processing unit;
the second processing unit is a co-processing unit;
the third processing unit is a real-time processing unit; and
the fourth processing unit is a graphics processing unit.

12. The control system of claim 10, wherein:
the second circuit board includes a vehicle navigation integrated circuit.

13. The control system of claim 10, wherein:
the first circuit board includes a first memory in operative communication with the first processing system; and the first circuit board includes a second memory in operative communication with the second processing system.

14. The control system of claim 10, wherein:
the RAM-based programmable logic array includes at least one field programmable gate array (FPGA) fabric accelerator for onboard sensor processing.

15. A control system for an unmanned vehicle (UV), comprising:
a housing defining an interior;
a control module disposed within the interior, the control module including a first processing system and a second processing system having heterogeneous field programmable architectures, the second processing system configured to transfer control of a first vehicle device of the UV from a first process of the first processing system to a second process of the second processing system based on execution of the first process by the first processing system and execution of the second process by the second processing system; and
a carrier module disposed within the interior, the carrier module including one or more interface circuits configured to provide an input/output (I/O) interface between the first vehicle device of the UV and the control module.

16. The control system of claim 15, wherein:
the first processing system includes a first processing unit and a RAM-based field programmable gate array;
the second processing system includes a second processing unit and a flash-based field programmable gate array;
the first processing unit executes the first process;
the second processing unit executes the second process; and
the flash-based field programmable gate array manages control of the first vehicle device based on the first process or the second process.

17. The control system of claim 16, wherein:
the one or more interface circuits are configured to provide the I/O interface between the first vehicle device and the first and second processing systems.

18. The control system of claim 15, wherein:
the first vehicle device is a sensor.

19. The control system of claim 15, wherein:
the first processing system includes at least two partitioned operating environments, the at least two partitioned operating environments including a high integrity partition and a cluster partition;
the high integrity partition includes a real-time operating environment configured for execution of one or more critical vehicle navigation processes; and
the cluster partition includes a non-real-time operating environment configured for execution of one or more mission control processes.

* * * * *